US012676188B2

(12) United States Patent
Xu et al.

(10) Patent No.: US 12,676,188 B2
(45) Date of Patent: Jul. 7, 2026

(54) MICROELECTRONIC DEVICES WITH MIRRORED BLOCKS OF MULTI-SET STAIRCASED STADIUMS, AND RELATED SYSTEMS AND METHODS

(71) Applicant: Micron Technology, Inc., Boise, ID (US)

(72) Inventors: Lifang Xu, Boise, ID (US); Umberto Maria Meotto, Dietlikon (CH); Aaron S. Yip, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 270 days.

(21) Appl. No.: 18/364,397

(22) Filed: Aug. 2, 2023

(65) Prior Publication Data

US 2024/0071501 A1 Feb. 29, 2024

Related U.S. Application Data

(60) Provisional application No. 63/373,975, filed on Aug. 30, 2022.

(51) Int. Cl.
H10B 43/10 (2023.01)
G11C 16/04 (2006.01)
(Continued)

(52) U.S. Cl.
CPC ......... G11C 16/0483 (2013.01); H10B 41/10 (2023.02); H10B 41/27 (2023.02);
(Continued)

(58) Field of Classification Search
CPC ........ G11C 11/40; H10B 41/20; H10B 41/41; H10B 41/50; H10B 43/20; H10B 43/50;
(Continued)

(56) References Cited

U.S. PATENT DOCUMENTS 8,759,217 B1 6/2014 Chen
9,589,978 B1 3/2017 Yip
(Continued)

OTHER PUBLICATIONS

Jain et al., "Microelectronic Devices With Staircased Stadiums and Both Through-Step and To-Step Contacts, and Related Systems and Methods," Substitute Specification filed May 31, 2022, for U.S. Appl. No. 17/709,020, 50 pages.
(Continued)

*Primary Examiner* — Fazli Erdem
(74) *Attorney, Agent, or Firm* — TraskBritt

(57) ABSTRACT

Microelectronic devices include a stack having a vertically alternating sequence of insulative and conductive structures arranged in tiers. Slit structures extend through the stack, dividing the stack into blocks. A first series of stadiums— within the stack of a first block of a pair of the blocks— includes at least one stadium having multiple parallel sets of staircases. A second series of stadiums—within the stack of a second block of the pair of blocks—includes at least one additional stadium having additional multiple parallel sets of staircases that are mirrored, across one of the slit structures, to the multiple parallel sets of staircases of the first series. In methods of fabrication, common mask openings are used to form the mirrored staircase profiles once stadiums are already at substantially their final depths in the stack structure. Electronic systems are also disclosed.

20 Claims, 32 Drawing Sheets

(51) Int. Cl.

| | |
|---|---|
| *H10B 41/10* | (2023.01) |
| *H10B 41/27* | (2023.01) |
| *H10B 41/35* | (2023.01) |
| *H10B 43/27* | (2023.01) |
| *H10B 43/35* | (2023.01) |
| *H10W 20/41* | (2026.01) |

(52) U.S. Cl.
CPC ............. *H10B 41/35* (2023.02); *H10B 43/10* (2023.02); *H10B 43/27* (2023.02); *H10B 43/35* (2023.02); *H10W 20/435* (2026.01)

(58) Field of Classification Search
CPC ........... H10W 20/056; H10W 20/0698; H10W 20/081; H10W 20/089; H10W 20/43
USPC ........................................................ 257/314
See application file for complete search history.

(56) References Cited

U.S. PATENT DOCUMENTS

| | | | |
|---|---|---|---|
| 9,779,948 | B1 | 10/2017 | Baraskar et al. |
| 10,373,970 | B2 | 8/2019 | Lee |
| 10,615,169 | B2 | 4/2020 | Van Schravendijk et al. |
| 10,818,681 | B2 | 10/2020 | Hu et al. |
| 10,879,175 | B2 | 12/2020 | Tessariol et al. |
| 10,910,395 | B2 | 2/2021 | Lee |
| 10,978,478 | B1 | 4/2021 | Yip |
| 11,088,017 | B2 | 8/2021 | Matovu et al. |
| 11,088,088 | B2 | 8/2021 | Jhothiraman et al. |
| 2017/0170191 | A1* | 6/2017 | Lee ........................ H10B 43/35 |

| | | | |
|---|---|---|---|
| 2017/0256551 | A1 | 9/2017 | Lee |
| 2019/0081061 | A1 | 3/2019 | Tessariol et al. |
| 2019/0371728 | A1 | 12/2019 | Gossman et al. |
| 2020/0091081 | A1 | 3/2020 | Hatazaki et al. |
| 2020/0357813 | A1 | 11/2020 | Tanzawa |
| 2021/0050357 | A1 | 2/2021 | Yip |
| 2021/0134825 | A1 | 5/2021 | Liu et al. |
| 2021/0151455 | A1 | 5/2021 | Xu et al. |
| 2021/0257298 | A1 | 8/2021 | Xu et al. |
| 2022/0084946 | A1 | 3/2022 | Park et al. |
| 2023/0010799 | A1 | 1/2023 | Xu et al. |
| 2023/0063111 | A1* | 3/2023 | Luo ................... H01L 21/76816 |

OTHER PUBLICATIONS

Jain et al., U.S. Appl. No. 17/709,020, Claims, Abstract, and Drawings, filed Mar. 30, 2022, 64 pages.

Moyer, "How It's Built: Micron/Intel 3D NAND," Electronic Engineering Journal, Feb. 1, 2016, 9 pages.

Ramasahayam et al., "Microelectronic Devices with Contacts Extending Through Metal Oxide Regions of Step Treads, and Related Systems and Methods," filed Jul. 12, 2022, for U.S. Appl. No. 17/812,141, 81 pages.

Wells et al., "Microelectronic Devices with a Tiered Stack of Conductive, Insulative, and Partially-Sacrificial Structures, and Related Systems and Methods," filed Aug. 24, 2022, for U.S. Appl. No. 17/822,101, 100 pages.

Xu et al., "Microelectronic Devices with Different Staircased Stadiums Having Consistent Multi-Tier Step Riser Height, and Related Systems and Methods," filed Mar. 30, 2022, for U.S. Appl. No. 17/657,264, 60 pages.

\* cited by examiner

100

146          146

404

402

1104

406

406

120    120      120      120

120

804

104

108

802

1008        1008

1010

152      150    152

150

MICROELECTRONIC DEVICES WITH MIRRORED BLOCKS OF MULTI-SET STAIRCASED STADIUMS, AND RELATED SYSTEMS AND METHODS

CROSS-REFERENCE TO RELATED APPLICATION

This application claims the benefit under 35 U.S.C. § 119(e) of U.S. Provisional Patent Application Ser. No. 63/373,975, filed Aug. 30, 2022, the disclosure of which is hereby incorporated in its entirety herein by this reference.

TECHNICAL FIELD

Embodiments of the disclosure relate to the field of microelectronic device design and fabrication. More particularly, the disclosure relates to microelectronic devices (e.g., memory devices, such as 3D NAND memory devices) with series of staircased stadiums formed in a tiered stack of conductive structures vertically alternating with insulative structures. The disclosure also relates to methods for forming such devices and to systems incorporating such devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. The stack of tiers vertically alternates conductive materials with insulating (e.g., dielectric) materials. The conductive materials function as control gates for, e.g., access lines (e.g., word lines) of the memory cells. Vertical structures (e.g., pillars comprising channel structures and tunneling structures) extend along the vertical string of memory cells. A drain end of a string is adjacent one of the top and bottom of the vertical structure (e.g., pillar), while a source end of the string is adjacent the other of the top and bottom of the pillar. The drain end is operably connected to a bit line, while the source end is operably connected to a source structure (e.g., a source plate, a source line). A 3D NAND memory device also includes electrical connections between, e.g., access lines (e.g., word lines) and other conductive structures of the device so that the memory cells of the vertical strings can be selected for writing, reading, and erasing operations.

Some 3D NAND memory devices include so-called "staircase" structures having "steps" (or otherwise known as "stairs") at edges (e.g., ends) of the tiers of the stack. The steps provide contact regions of conductive structures of the device (e.g., contact regions to conductive materials of the tiered stack), such as of access lines (e.g., word lines). Contact structures may be formed in physical contact with the steps to provide electrical access to the conductive structures (e.g., word lines) associated with the steps. The contact structures may be in electrical communication, via conductive routing lines, to additional contact structures that communicate to a source/drain region. String drivers drive the access line (e.g., word line) voltages to write to or read from the memory cells controlled via the access lines (e.g., word lines).

A continued goal in the microelectronic device fabrication industry is to minimize the footprint of the features of microelectronic devices so as to maximize the number of devices, and functional features thereof, in a given structural area. However, as device and feature sizes are reduced (e.g., scaled to smaller sizes), precise and accurate fabrication continues to present challenges.

DETAILED DESCRIPTION

Figure 1:
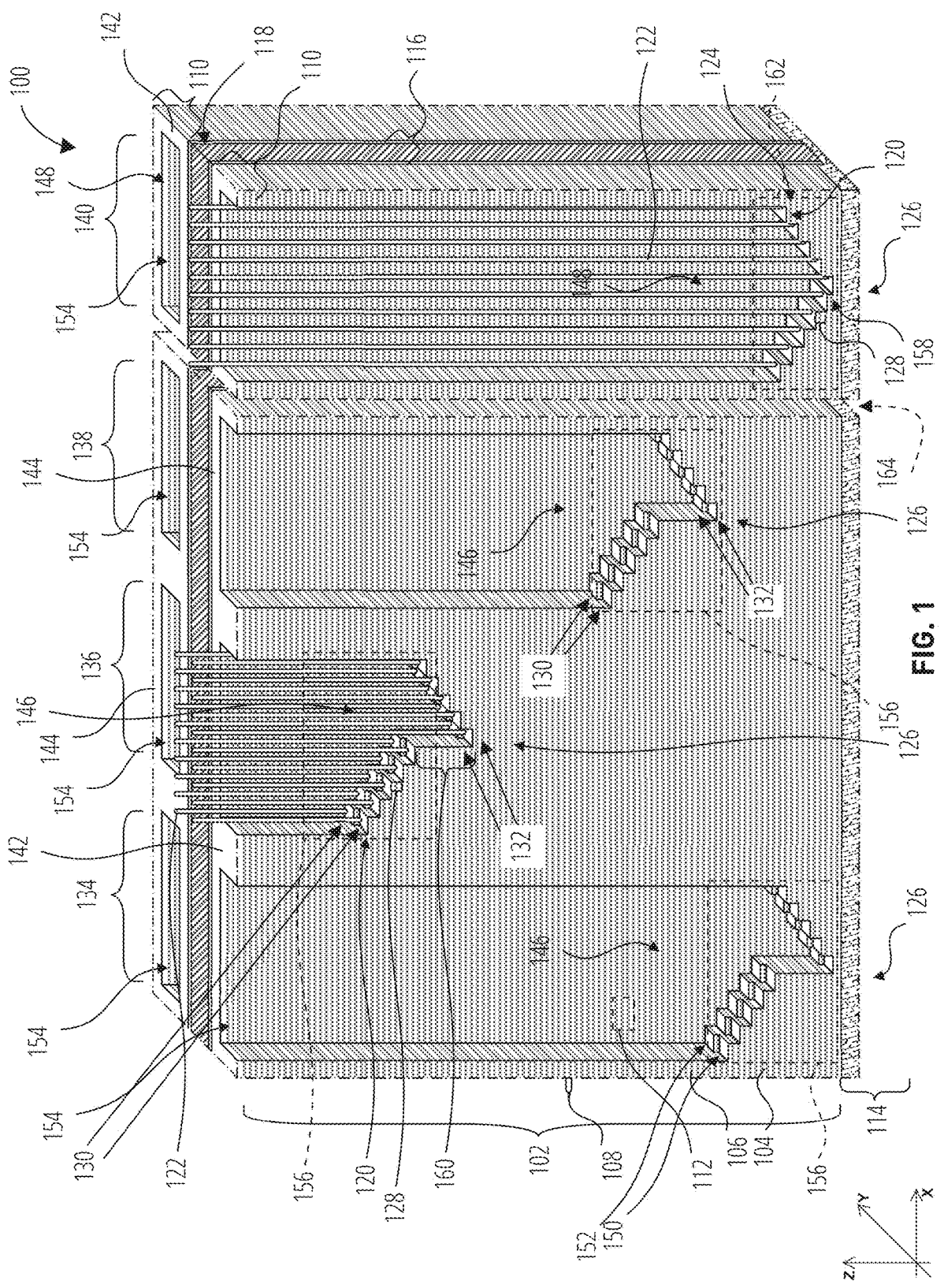
FIG. 1 is a schematic, cross-sectional, perspective view of a microelectronic device structure of a microelectronic device, according to embodiments of the disclosure.

Structures (e.g., microelectronic device structures), apparatuses (e.g., microelectronic devices), and systems (e.g., electronic systems), according to embodiments of the disclosure, include a stack of vertically alternating conductive structures and insulative structures arranged in tiers. Slit structures extend vertically through the stack to divide the stack into blocks. A series of stadiums is patterned into the tiered stack of each block, with non-patterned "crest" portions of the stack spacing laterally neighboring stadiums from one another. The stadiums include staircase structures having steps at ends of stepped tiers of the stack. The steps include treads defined by upper horizontal surfaces of structures (e.g., insulative structures) of the stepped tiers. In their respective staircases, the steps also include risers defined by vertical sidewalls, at the distal end of the treads, of multiple of the tiers (e.g., multiple of the conductive structures and multiple of the insulative structures). A conductive "step contact" (e.g., access line contact, word line contact) extends to each step of the staircases. Some or all of the stadiums of a respective block each include multiple parallel sets of staircases, including at least one upper staircase and at least one lower staircase, wherein the upper staircase has steps at elevations at least one tier height above the steps of the lower staircase. Neighboring pairs of the blocks are patterned so that their staircase profiles mirror one another across the intervening slit structure. During formation (e.g., etching) of the staircases within the mirrored blocks, the lower staircases may be formed (e.g., etched) at the base of final-depth stadium openings via a common masked opening for each pair of mirrored stadiums. The common masked opening may be relatively long, which may facilitate fabrication accuracy for precisely forming the multiple sets of staircases of the mirrored stadiums.

As used herein, the term "series of stadiums" means and refers to a group of stadiums distributed across a stack structure in a row (e.g., in the illustrated X-axis direction), with neighboring stadiums spaced from one another by a non-patterned "crest" portion of the stack. Each block may include a single "series of stadiums."

As used herein, the term "set of staircases" means and refers to one or more staircases that collectively define a row (e.g., in the illustrated X-axis direction) of steps, each of which steps may be at a respectively different tier elevation of a stack structure. A respective "set of staircases" may include one or more descending staircases, one or more ascending staircases, or any combination thereof.

As used herein, the term "descending staircase" means and refers to a staircase generally exhibiting negative slope, as defined by a phantom line extending from a vertically highest step of the staircase to a vertically lowest step of the staircase.

As used herein, the term "ascending staircase" means and refers to a staircase generally exhibiting positive slope, as defined by a phantom line extending from a vertically highest step of the staircase to a vertically lowest step of the staircase.

As used herein, the term "high-aspect-ratio" means and refers to a height-to-width (e.g., a ratio of a maximum height to a maximum width) of greater than about 10:1 (e.g., greater than about 20:1, greater than about 30:1, greater than about 40:1, greater than about 50:1, greater than about 60:1, greater than about 70:1, greater than about 80:1, greater than about 90:1, greater than about 100:1).

As used herein, a feature referred to with the adjective "source/drain" means and refers to the feature being configured for association with either or both the source region and the drain region of the device that includes the "source/drain" feature. A "source region" may be otherwise configured as a "drain region" and vice versa without departing from the scope of the disclosure.

As used herein, the terms "opening," "trench," and "slit" mean and include a volume extending through or into at least one structure or at least one material, leaving a gap in that at least one structure or at least one material, or a volume extending between structures or materials, leaving a gap between the structures or materials. Unless otherwise described, an "opening," "trench," and/or "slit" is not necessarily empty of material. That is, an "opening," "trench," or "slit" is not necessarily void space. An "opening," "trench," or "slit" formed in or between structures or materials may comprise structure(s) or material(s) other than that in or between which the opening is formed. And, structure(s) or material(s) "exposed" within an opening, trench, or slit is/are not necessarily in contact with an atmosphere or non-solid environment. Structure(s) or material(s) "exposed" within an opening, trench, or slit may be adjacent or in contact with other structure(s) or material(s) that is/are disposed within the opening, trench, or slit.

As used herein, the terms "substrate" and "base structure" mean and include a base material or other construction upon which components, such as tiered stacks and structures therein, are formed. The substrate or base structure may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" or "base structure" in the following description, previous process stages may have been utilized to form materials, structures, or junctions in the base semiconductor structure, base structure, or other foundation.

As used herein, the terms "insulative" and "insulating," when used in reference to a material or structure, means and includes a material or structure that is electrically insulative or electrically insulating. An "insulative" or "insulating" material or structure may be formed of and include one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_x N_y$)), at least one dielectric carboxynitride material (e.g., a silicon carboxynitride ($SiO_x C_z N_y$)), and/or air. Formulae including one or more of "x," "y," and/or "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and/or "z" atoms of an additional element (if any), respectively, for every one atom of another element (e.g., Si, Al, Hf, Nb, Ti). As the formulae are representative of relative atomic ratios and not strict chemical structure, an insulative material or insulative structure may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative" or "insulating" structure means and includes a structure formed of and including "insulative" or "insulating" material.

As used herein, the terms "conductive" and "conducting," when used in reference to a material or structure, mean and include a material or structure that is electrically conductive or electrically conducting, unless otherwise specified (e.g., as "thermally conductive" or "thermally conducting"). A "conductive" or "conducting" material or structure may be formed of and include one or more metals or metal-containing compositions. The one or more metals or metal-containing compositions may be in the form of a single homogeneous material region, in the form of multiple material regions (e.g., as one material region at least partially lined by a second material region (e.g., liner)). The metals may include one or more of tungsten (W), titanium (Ti), nickel (Ni), platinum (Pt), rhodium (Rh), ruthenium (Ru), iridium (Jr), aluminum (Al), copper (Cu), molybdenum (Mo), silver (Ag), gold (Au). Metal-containing compositions may include one or more alloys, nitrides, silicides, carbides, and/or oxides of and including any of the foregoing metals, such as a material including one or more of titanium nitride (TiN), tantalum nitride (TaN), tungsten nitride (WN), titanium aluminum nitride (TiAlN), iridium oxide (IrO$_x$), ruthenium oxide (RuO$_x$), and/or alloys thereof. In some embodiments, a "conductive" or "conducting" material or structure may be formed of and include one or more conductively doped semiconductor material (e.g., conductively doped silicon, conductively doped germanium, conductively doped silicon germanium) and/or polysilicon.

As used herein, the term "sacrificial," when used in reference to a material or structure, means and includes a material or structure that is formed during a fabrication process but which is removed (e.g., substantially removed) prior to completion of the fabrication process.

As used herein, the term "horizontal" means and includes a direction that is parallel to a primary surface of the substrate on which the referenced material or structure is located. The "width" and "length" of a respective material or structure may be defined as dimensions in a horizontal plane. With reference to the figures, the "horizontal" direction may be perpendicular to an indicated "Z" axis, may be parallel to an indicated "X" axis, and may be parallel to an indicated "Y" axis.

As used herein, the term "lateral" means and includes a direction in a horizontal plane parallel to a primary surface of the substrate on which a referenced material or structure is located and substantially perpendicular to a "longitudinal" direction. The "width" of a respective material or structure may be defined as a dimension in the lateral direction of the horizontal plane. With reference to the figures, the "lateral" direction may be parallel to an indicated "X" axis, may be perpendicular to an indicated "Y" axis, and may be perpendicular to an indicated "Z" axis.

As used herein, the term "longitudinal" means and includes a direction in a horizontal plane parallel to a primary surface of the substrate on which a referenced material or structure is located, and substantially perpendicular to a "lateral" direction. The "length" of a respective material or structure may be defined as a dimension in the longitudinal direction of the horizontal plane. With reference to the figures, the "longitudinal" direction may be parallel to an indicated "Y" axis, may be perpendicular to an indicated "X" axis, and may be perpendicular to an indicated "Z" axis.

As used herein, the term "vertical" means and includes a direction that is perpendicular to a primary surface of the substrate on which a referenced material or structure is located. The "height" of a respective material or structure may be defined as a dimension in a vertical plane. With reference to the figures, the "vertical" direction may be parallel to an indicated "Z" axis, may be perpendicular to an indicated "X" axis, and may be perpendicular to an indicated "Y" axis.

As used herein, the term "width" means and includes a dimension, along an indicated "X" axis in a horizontal plane (e.g., at a certain elevation, if identified), defining a maximum distance, along such "X" axis in the horizontal plane, of the whole of the material or structure in question or of a concerned portion of the material or structure in question. For example, a width of a conductive or insulative structure may be a maximum X-axis dimension from one lateral end of the conductive or insulative structure to an opposite lateral end of the structure, whereas a width of a step defined by the conductive or insulative structure may be a maximum X-axis dimension of only that portion of the conductive or insulative structure that provides the step.

As used herein, the term "length" means and includes a dimension, along an indicated "Y" axis in a horizontal plane (e.g., at a certain elevation, if identified), defining a maximum distance, along such "Y" axis in the horizontal plane, of the material or structure in question or of a concerned portion of the material or structure in question. For example, a length of a conductive or insulative structure may be a maximum Y-axis dimension from one block-defining slit to another block-defining slit, whereas a length of a step defined by the conductive or insulative structure may be a maximum Y-axis dimension of only that portion of the conductive or insulative structure that provides the step (e.g., the step tread).

As used herein, the terms "thickness" or "thinness" are spatially relative terms that mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material or structure relative to at least two other materials or structures. The term "between" may encompass both a disposition of one material or structure directly adjacent the other materials or structures and a disposition of one material or structure indirectly adjacent to the other materials or structures.

As used herein, the term "proximate" is a spatially relative term used to describe disposition of one material or structure near to another material or structure. The term "proximate" includes dispositions of indirectly adjacent to, directly adjacent to, and internal to.

As used herein, features (e.g., regions, materials, openings, structures, assemblies, devices) described as "neighboring" one another mean and include features of the disclosed identity (or identities) that are located most proximate (e.g., closest to) one another. One or more additional features (e.g., additional regions, additional materials, additional structures, additional openings, additional assemblies, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with the "neighboring" features is positioned between the "neighboring" features. For example, a structure of material X "neighboring" a structure of material Y is the first material X structure, e.g., of multiple material X structures, that is nearest the particular structure of material Y. Accordingly, features described as "vertically neighboring" one another mean and include features of the disclosed identity (or identities) that are located most vertically proximate (e.g., vertically closest to) one another. Moreover, features described as "horizontally neighboring" one another mean and include features of the disclosed identity (or identities) that are located most horizontally proximate (e.g., horizontally closest to) one another.

As used herein, the term "consistent"—when referring to a parameter, property, or condition of one structure, material, feature, or portion thereof in comparison to the parameter, property, or condition of another such structure, material, feature, or portion of such same aforementioned structure, material, or feature—is a relative term that means and includes the parameter, property, or condition of the two such structures, materials, features, or portions being equal, substantially equal, or about equal, at least in terms of respective dispositions of such structures, materials, features, or portions. For example, two structures having "consistent" heights as one another may each define a same, substantially same, or about the same height, from a lower surface to an upper surface of each respective such structure, despite the two structures being at different elevations of a larger structure.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0 percent met, at least 95.0 percent met, at least 99.0 percent met, or even at least 99.9 percent met.

As used herein, the terms "on" or "over," when referring to an element as being "on" or "over" another element, are spatially relative terms that mean and include the element being directly on top of, adjacent to (e.g., laterally adjacent to, horizontally adjacent to, longitudinally adjacent to, vertically adjacent to), underneath, or in direct contact with the other element. It also includes the element being indirectly on top of, adjacent to (e.g., laterally adjacent to, horizontally adjacent to, longitudinally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, any spatially relative terms used in this disclosure are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one material's or feature's relationship to another material(s) or feature(s) as illustrated in the figures, using—as a reference point—the lowest illustrated surface of the structure that includes the materials or features. As used herein, a "level" and an "elevation" are each defined by a horizontal plane parallel to a primary surface of the substrate or base structure on or in which the structure (that includes the materials or features) is formed. When used with reference to the drawings, "lower levels" and "lower elevations" are relatively nearer to the bottom-most illustrated surface of the respective structure, while "higher levels" and "higher elevations" are relatively further from the bottom-most illustrated surface of the respective structure.

As used herein, the term "depth" is a spatially relative term used to describe one material's or feature's relationship to another material(s) or feature(s) as illustrated in the figures, using—as a reference point—the highest illustrated surface of the structure (e.g., stack structure) that includes the materials or features. When used with reference to the drawings, a "depth" is defined by a horizontal plane parallel to the highest illustrated surface of the structure (e.g., stack structure) that includes the materials or features.

Unless otherwise specified, any spatially relative terms used in this disclosure are intended to encompass different orientations in addition to the orientation as depicted in the drawings. For example, the materials in the drawings may be inverted, rotated, etc., with the "upper" levels and elevations then illustrated proximate the bottom of the page, the "lower" levels and elevations then illustrated proximate the top of the page, and the greatest "depths" extending a greatest vertical distance upward.

As used herein, the terms "comprising," "including," "having," and grammatical equivalents thereof are inclusive, open-ended terms that do not exclude additional, unrecited elements or method steps. These terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a material (e.g., composition) described as "comprising," "including," and/or "having" a species may be a material that, in some embodiments, includes additional species as well and/or a material that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" means and includes any and all combinations of one or more of the associated listed items.

As used herein, the singular forms "a," "an," and "the" are intended to include the plural forms as well, unless the context clearly indicates otherwise.

As used herein, an "(s)" at the end of a term means and includes the singular form of the term and/or the plural form of the term, unless the context clearly indicates otherwise.

As used herein, the terms "configured" and "configuration" mean and refer to a size, shape, material composition, orientation, and arrangement of a referenced feature (e.g., region, material, structure, opening, assembly, device) so as to facilitate a referenced operation or property of the referenced feature in a predetermined way.

The illustrations presented herein are not meant to be actual views of any particular material, structure, substructure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded; surfaces and features illustrated to be vertical may be non-vertical, bent, and/or bowed; and/or structures illustrated with consistent transverse widths and/or lengths throughout the height of the structure may taper in transverse width and/or length. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

Figure 2:
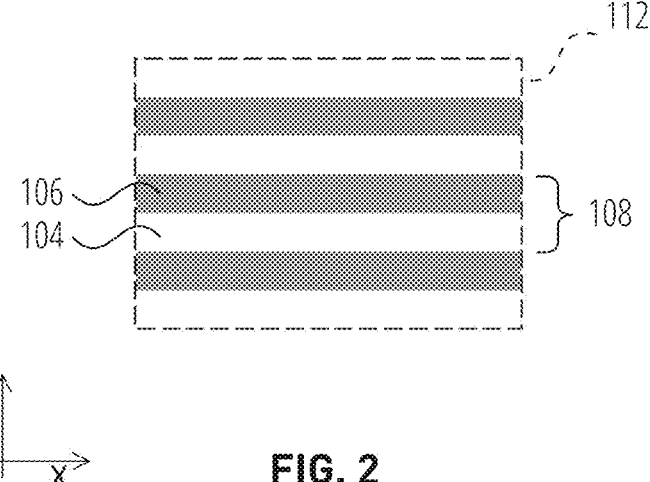
FIG. 2 is an enlarged view of the area of box 112 of FIG. 1.

With reference to FIG. 1, illustrated is a microelectronic device structure 100 that includes a stack 102 (which may otherwise be referred to herein as a "stack structure" or as a "tiered stack") of vertically alternating (e.g., vertically interleaved) insulative structures 104 and conductive structures 106 arranged in tiers 108 and divided into blocks 110. Each tier 108—as the term "tier" is used herein—includes one of the insulative structures 104 and one of the conductive structures 106 vertically neighboring the one of the insulative structures 104. This vertically alternating, interleaved arrangement of the insulative structures 104 and the conductive structures 106 providing the tiers 108 is illustrated in greater detail in FIG. 2, which is an enlargement of the area of box 112 of FIG. 1, but may be equally illustrative of other portions of the stack 102.

With continued reference to FIG. 1, the number (e.g., quantity) of tiers 108 (and conductive structures 106) illustrated is for example only, and the disclosure is not so limiting. For example, a microelectronic device structure, in accordance with embodiments of the disclosure, may include a different quantity of the tiers 108 (e.g., and of the conductive structures 106) in the stack 102. In some embodiments, the stack 102 includes one-hundred twenty-six or one-hundred twenty-eight of the tiers 108 (and of the conductive structures 106). The number (e.g., quantity) of the tiers 108—and therefore of the conductive structures 106—of the stack 102 may be within a range of from thirty-two to three-hundred or more. The tiers 108 may be included in one or more decks of the stack 102.

The conductive structures 106 may be formed of and include (e.g., each be formed of and include) one or more conductive materials, such as one or more of: at least one metal (e.g., one or more of tungsten, titanium, nickel, platinum, rhodium, ruthenium, iridium, aluminum, copper, molybdenum, silver, gold), at least one alloy (e.g., an alloy of one or more of the aforementioned metals), at least one metal-containing material that includes one or more of the aforementioned metals (e.g., metal nitrides, metal silicides, metal carbides, metal oxides, such as a material including one or more of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof), at least one conductively-doped semiconductor material (e.g., conductively-doped silicon, conductively-doped germanium, conductively-doped silicon germanium), polysilicon, and at least one other material exhibiting electrical conductivity. In some embodiments, the conductive structures 106 include at least one of the aforementioned conductive materials along with at least one additional of the aforementioned conductive materials formed as a liner. Some or all of the conductive structures 106 may have the same (e.g., consistent) or different thicknesses (e.g., heights) as one another.

The insulative structures 104 may be formed of and include (e.g., each be formed of and include) at least one insulative material, such as a dielectric oxide material (e.g., silicon dioxide). In this and other embodiments described herein, the insulative material of the insulative structures 104 may be substantially the same as or different than other insulative material(s) of the microelectronic device structure 100. Some or all of the insulative structures 104 may have the same (e.g., consistent) or different thicknesses (e.g., heights) as one another. In some embodiments, some of the insulative structures 104 (e.g., an uppermost, a lowest, and/or intermediate insulative structure 104) are relatively thicker than others of the insulative structures 104 in the stack 102.

The stack 102 may be provided on or over a base structure 114, which may include one or more regions formed of and including, for example, one or more semiconductor materials (e.g., polycrystalline silicon (polysilicon)) doped with one or more P-type conductivity chemical species (e.g., one or more of boron, aluminum, and gallium) and/or one or more N-type conductivity chemical species (e.g., one or more of arsenic, phosphorous, and antimony) to provide one or more source/drain regions of the microelectronic device structure 100.

In addition to the semiconductor materials and/or source/drain region, the base structure 114 may include other base material(s) or structure(s), such as conductive regions for making electrical connections with other conductive structures of the device that includes the microelectronic device structure 100. In some such embodiments, CMOS (complementary metal-oxide-semiconductor) circuitry is included, within the base structure 114, in a CMOS region below the source/drain region, which CMOS region may be characterized as a so-called "CMOS under Array" ("CuA") region.

Figure 3:
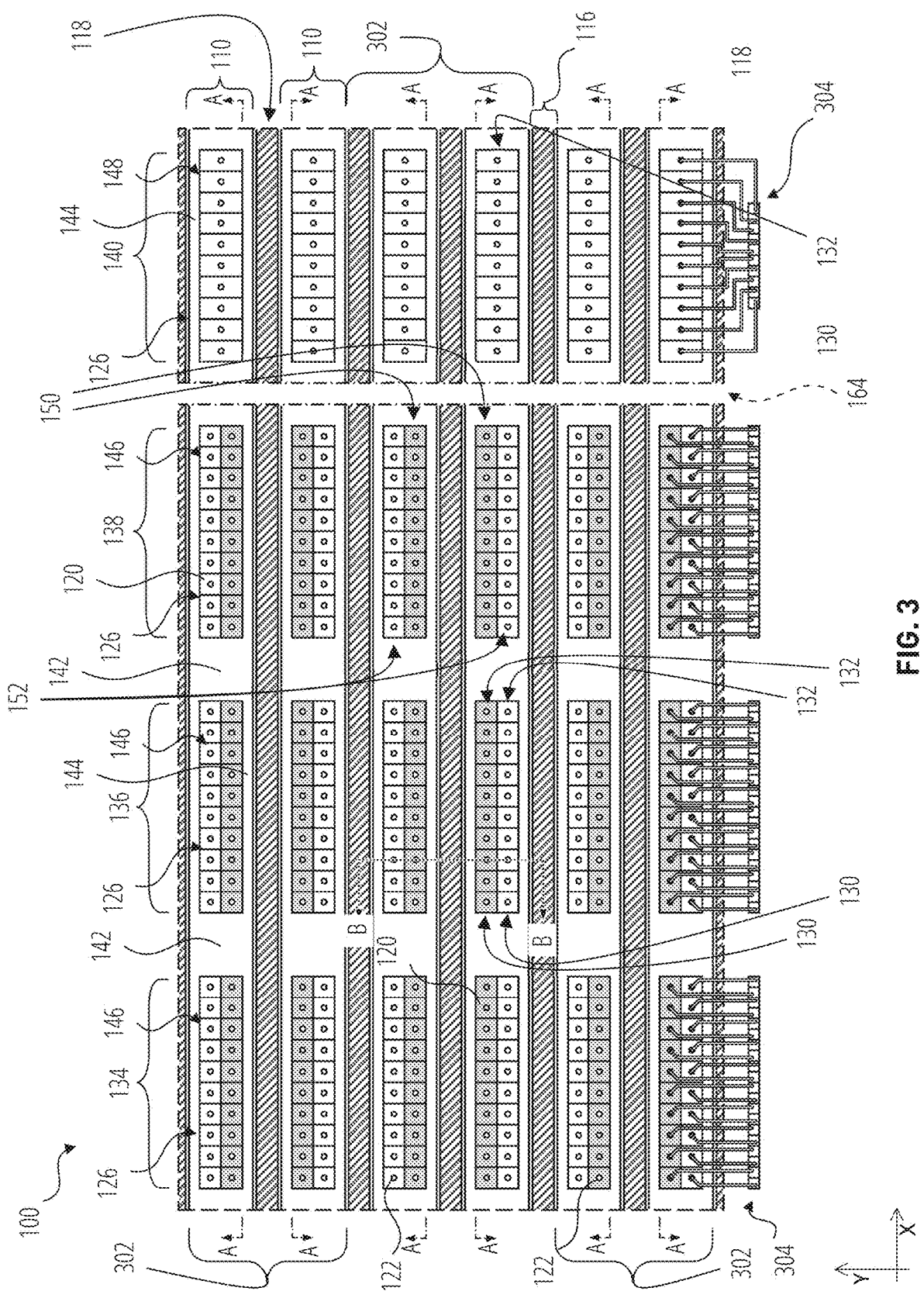
FIG. 3 is a top plan, schematic view of the microelectronic device that may include the microelectronic device structure of FIG. 1, wherein the front of FIG. 1 corresponds to a view from any of section lines A-A of FIG. 3.

With continued reference to FIG. 1 and also with reference to FIG. 3—which is a top plan view of a microelectronic device that may include the microelectronic device structure 100 of FIG. 1—a series of slit structures 116 or other elongate structures formed in slits 118 extends through the stack 102 to divide the stack 102 into a series of the blocks 110. Each block 110 extends in the lateral direction (e.g., with a greater dimension (e.g., width) in the "X"-axis direction than a dimension (e.g., length) in the "Y"-axis direction). A pair of the slits 118 may be formed, parallel to the "X"-axis, to define the front and rear of a respective one of the blocks 110 of the microelectronic device structure 100.

With continued reference to FIG. 3, the blocks 110 may be grouped in longitudinally neighboring pairs. As described further below, the structures of the blocks 110 of each neighboring pair may be mirrored about (e.g., across) the intervening slit structure 116. Herein, these longitudinally neighboring, pairs of blocks with mirrored structures are referred to as "mirrored blocks" 302. Accordingly, FIG. 1 illustrates both a front-side elevational cross-sectional of a portion of one block 110 of a pair of mirrored blocks 302 and also a rear-side elevational cross-sectional view of a corresponding portion of the other block 110 of the pair of mirrored blocks 302.

Each slit structure 116 may include one or more non-conductive material(s) substantially filling the slits 118. In some embodiments, each slit structure 116 includes at least one non-conductive material (e.g., silicon, insulative material) lined by at least one other non-conductive material (e.g., another insulative material).

Other portions of the microelectronic device structure 100 (e.g., portions horizontally disposed relative to the portions illustrated in, e.g., FIG. 1 and FIG. 3) may include array(s) of pillars (e.g., including channel material and memory material) extending through the stack 102 and to and/or into the base structure 114 (e.g., to and/or into a source/drain region). The pillars may effectuate the formation of strings of memory cells of a memory device (e.g., a memory device including any of the microelectronic device structures described or illustrated herein). The conductive structures 106 of the tiers 108 may be coupled to, or may form control gates of, the memory cells effectuated by the pillars. For example, each conductive structure 106 may be coupled to an individual memory cell of a particular string (e.g., effectuated by a particular pillar) of memory cells.

To facilitate electrical communication to particular selected conductive structures 106 within the stack 102, conductive contact structures extend to (or from) and physically contact the conductive structures 106 of the tiers 108. Each such conductive contact structure is positioned to physically contact a particular one of the conductive structures 106 at or in a step 120 that includes a tread in the form of an exposed upper (e.g., horizontal) surface portion of one of the conductive structures 106 or insulative structures 104. In embodiments in which the step 120 treads are provided by upper surfaces of the conductive structure 106, the tread of the step 120 functions as a landing area for physical contact with one of the conductive contact structures, which are referred to herein as "step contacts" 122. In embodiments in which the step 120 treads are provided by upper surfaces of the insulative structures 104, the step contacts 122 may extend through the treaded insulative structures 104 to land on the underlying conductive structures 106 associated with the steps 120.

With continued reference to FIG. 1, to provide the steps 120 of the conductive structures 106, the stack 102 is patterned (e.g., etched) to expose one or more upper (e.g., horizontal) surface area portion(s) of individual tiers 108, such as upper (e.g., horizontal) surface area portion(s) of individual insulative structures 104 of the stack 102. That is, the tiers 108 are selectively patterned to remove portions of otherwise-overlying tiers 108 to leave exposed (until otherwise covered by fill material and/or step contacts 122) at least one upper surface area of, the insulative structure 104 of the next lower tier 108. Each exposed area provides one step 120 for the respective tier 108, and each step 120 is associated with at least one insulative structure 104 (e.g., the insulative structure 104 with an exposed upper surface area) and at least one conductive structure 106 (e.g., the conductive structure 106 immediately vertically below the insulative structure 104 with the exposed upper surface area). In embodiments in which exposed upper surface areas of the insulative structures 104 provide the tread of the steps 120, the immediately underlying area of the vertically neighboring conductive structure 106 provides the landing area for the step 120 associated with the tier 108 providing the step 120 (referred to herein as the "stepped tier" 124).

Because individual conductive structures 106 and their respective tiers 108 in the stack 102 occupy different elevations of the stack 102 (also referred to herein as different "tier elevations"), the steps 120 are formed at the various elevations of the tiers 108, and each step contact 122 extends downward to physically contact (e.g., "land on") the uppermost conductive structure 106 of the respective step 120.

The vertical dimension (e.g., height) of an individual step contact 122 may be tailored according to the depth (e.g., elevation) of its respective step 120. The step contacts 122 extending to steps 120 of relatively shallower stadiums 126, e.g., in the relatively higher elevations of the stack 102, may be generally shorter than the step contacts 122 that extend to steps 120 of relatively deeper stadiums 126, e.g., in relatively lower elevations of the stack 102. The microelectronic device structure 100 may include, in each respective block 110, at least one step contact 122 per step 120 and, therefore, at least one step contact 122 per tier 108 (e.g., and therefore per conductive structure 106) in the stack 102.

The steps 120 are grouped in staircases with each staircase providing at least a part of a row (extending in the X-axis direction) of the steps 120, all or at least some of which are at different tier elevations than others of the steps 120 in the staircase. The tier elevations of the steps 120 of a respective staircase may incrementally decrease or incrementally increase through the staircase according to a "riser height" 128. For example, in one staircase, the steps 120 may be formed at successively increasing tier 108 depths (e.g., decreasing tier 108 elevations) to define a descending staircase 130 having generally negative slope. In another staircase, the steps 120 may be formed at successively decreasing tier 108 depths (e.g., increasing tier 108 elevations) to define an ascending staircase 132 having generally positive slope. The elevation difference between neighboring steps 120 of the row of steps 120 of a respective staircases (e.g., one of the descending staircases 130, one of the ascending staircases 132) defines the riser height 128.

The staircases (e.g., the descending staircases 130 and the ascending staircases 132) are grouped in so-called "stadiums" 126. Each set of staircases extends the width of each stadium 126. As used herein, a "set" of staircases comprises the one or more staircases that are horizontally aligned in the X-axis direction within a respective stadium 126 and that extend the width of the stadium 126.

The stadiums 126, of a respective block 110 of the microelectronic device structure 100, may be arranged in a series such that multiple stadiums 126 are distributed across a width of the block 110 and extend, in a row (e.g., in the X-axis direction), substantially parallel to the slits 118 (and to the slit structures 116), as illustrated in FIG. 1 and FIG. 3. The microelectronic device structure 100 may include as many stadiums 126 at various elevation groups, within a respective block 110 (and stadium series), as necessary to include at least one step 120 per tier 108 (and per conductive structure 106) of the stack 102. Each stadium 126 may be formed in a different horizontal area of the block 110, such in a first stadium area 134, a second stadium area 136, a third stadium area 138, a fourth stadium area 140, etc.

Laterally neighboring stadiums 126 may be spaced from one another, in the stadium series of the block 110, by a so-called "crest" 142 of the stack 102. The crests 142 may be formed by areas of the stack 102 where the tiers 108 have not been patterned. The crests 142 may, therefore, extend an entire height of the stack 102. In some embodiments, uppermost boundaries of the crests 142 may be positioned at (e.g., coplanar with) uppermost boundaries of the stack 102.

In some embodiments, through-stack conductive structures (e.g., contacts, support structures) may be included in the crests 142. These through-stack conductive structures may be non-electrically functional (e.g., "dummy" contacts, support structures) or may be in electrical communication (e.g., via circuitry shown above the lowest-illustrated block 110 of FIG. 3) between the step contacts 122 and other electrical components in the base structure 114 or elsewhere in the device, such as in electrical communication with string drivers 304 (schematically illustrated in FIG. 3).

String drivers 304 (e.g., access line drivers, word line drivers) may be configured to selectively supply access signals, such as programming signals (e.g., programming voltages) to the conductive structures 106 (e.g., to access lines, also known as "word lines") at particular levels of the stack 102 so as to access (e.g., program) the memory cell(s) (e.g., in the array portions 702 (FIG. 7)) that are operatively associated with respective conductive structures 106. There may be one string driver 304 coupled to one respective conductive structure 106 (e.g., access line), such that the microelectronic device structure 100 may include one string driver 304 for each respective stepped tier 124 (e.g., each respective conductive structure 106 that is associated with at least one step 120). The string drivers 304 operatively associated with the stepped tiers 124 of a particular block 110 may be disposed below the stack 102 of the block 110, such as in or under the base structure 114 (FIG. 1), above the stack 102 of the block 110, and/or within other areas of the microelectronic device structure 100.

Within each block 110, one or more other non-patterned portions of the stack 102 may form a so-called "bridge" 144 that extends a width of the block 110. The bridge(s) 144 may extend the entire height of the stack 102. In some embodiments, uppermost boundaries of the bridge(s) 144 may be positioned at (e.g., coplanar with) uppermost boundaries of the stack 102. The bridge 144 may border one of the slits 118 (and slit structures 116) that define the block 110 length (Y-axis dimension). In some embodiments, each block 110 includes two bridges 144, and each bridge 144 borders a different one of the slits 118 (and slit structures 116) that define the block 110, as illustrated in FIG. 3. Via the one or more bridges 144, distal portions of a given conductive structure 106 of a respective tier 108 are part of a continuous, single conductive structure 106 of that tier 108. Therefore, an electrical connection between one or more of the step contacts 122 and one of the steps 120 may provide an electrical connection between the one or more step contacts 122 and the whole of the conductive structure 106—that provides the step 120 of the respective stepped tier 124—throughout the block 110.

With returned reference to FIG. 1, at least one of (e.g., a majority of, all of) the stadiums 126 of the series in the block 110 includes multiple sets of parallel staircases and so is referred to herein as a "multi-set stadium" 146. In such multi-set stadium 146, each step 120 tread may span only a portion (e.g., about half) of the whole length (Y-axis dimension) of the stadium 126, as most easily seen in the top plan illustration of FIG. 3 for the stadiums 126 in the first stadium area 134, the second stadium area 136, and the third stadium area 138. The multiple sets of staircases define multiple rows of staircases—and therefore multiple rows of steps 120 (one row per set)—in the multi-set stadium 146. Multiple rows of step contacts 122 may extend to the conductive structures 106 of the steps 120 of the multi-set stadiums 146, as illustrated for the bottom-most illustrated block 110 of FIG. 3. Such multiple rows of step contacts 122 may also be within the horizontal area of the multi-set stadiums 146 of the other blocks 110 of the microelectronic device structure 100 of FIG. 3, but are not illustrated for ease of viewing the steps 120 and step contacts 122 in the other multi-set stadiums 146.

With multiple sets of parallel staircases in the multi-set stadium 146, the multi-set stadium 146 provides multiple more (e.g., twice as many) steps 120, and accommodates connection to multiple more (e.g., twice as many) step contacts 122 (FIG. 1), compared to a stadium with only a single staircase set (e.g., a single row of steps 120), such as the stadium 126 illustrated in the fourth stadium areas 140 of FIG. 1 and FIG. 3. These single-staircase stadiums are referred to herein as "single-set stadiums" 148.

Though both one multi-set stadium 146 and one single-set stadium 148 may occupy substantially equal stadium areas (e.g., footprint of the stack 102), multiple (e.g., twice) as many electrical connections may be facilitated by the multi-set stadium 146 as the single-set stadium 148. However, because the steps 120 of the staircases of the multi-set stadiums 146 are generally about half the horizontal area of the steps 120 of the staircases of the single-set stadiums 148, conventional methods for forming staircased stadiums may not facilitate forming the multi-set stadiums 146 of the microelectronic device structure 100 precisely and accurately, particularly for relatively deeper multi-set stadiums 146 (e.g., in the first stadium area 134 and the third stadium area 138 of FIG. 1). Accordingly, the multi-set stadiums 146 of the microelectronic device structure 100 may be formed by methods, described below, that enable precise and accurate formation of the steps 120 (and staircases) of the multi-set stadiums 146.

Figure 4:
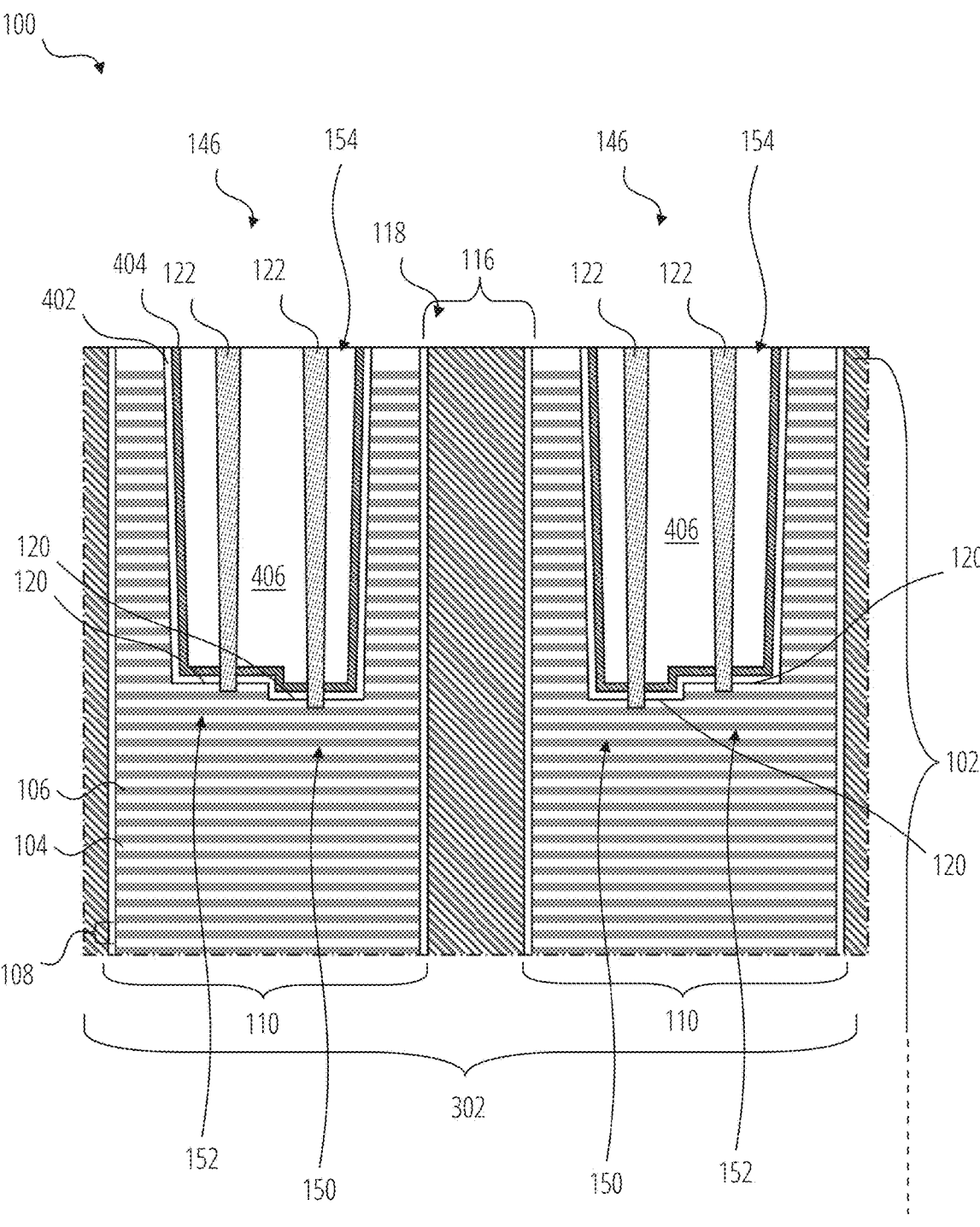
FIG. 4 is a schematic, cross-sectional, elevational view of a pair of mirrored blocks of the microelectronic device structure of FIG. 1, wherein the view of FIG. 4 corresponds to a view from section line B-B of FIG. 3.

With reference to FIG. 4, illustrated is a view of steps 120 of longitudinally neighboring multi-set stadiums 146 of mirrored blocks 302. This view corresponds to section line B-B of FIG. 3. As shown, the blocks 110 each have a step 120 structure that substantially mirrors one another across the intervening slit 118 and slit structure 116. Accordingly, the steps 120 of a lower staircase set 150 of the multiple sets of staircases of the multi-set stadium 146 may be proximate the slit 118 (and the slit structure 116), and the steps 120 of an upper staircase set 152 of the multiple sets of staircases may be distal from the slit 118 (and the slit structure 116). Correspondingly, a next block 110 to the right of the blocks 110 illustrated in FIG. 4 may have a structure (and staircase profile) substantially mirroring that of the right-most illustrated block 110, such that the upper staircase sets 152 is proximate the intervening slit 118 (and slit structure 116) and the lower staircase sets 150 is distal from that slit 118 (and slit structure 116).

FIG. 4 also illustrates, in more detail, the step contacts 122 extending to the conductive structures 106 of the steps 120. To reach the conductive structures 106, each step contact 122 may extend through the insulative structure 104 of the respective step 120.

As also shown in FIG. 4, one or more liners (e.g., first stadium liner 402, second stadium liner 404) and one or more fill materials 406 may substantially fill the remaining openings (e.g., trenches), referred to herein as "stadium openings" 154 (e.g., "stadium trenches") vertically overlying and partially defined by the stadiums 126 (e.g., single-set stadiums 148, multi-set stadiums 146) to electrically insulate the step contacts 122 from one another. The liners (e.g., first stadium liner 402, second stadium liner 404) and fill material(s) 406 are not illustrated in FIG. 1 and FIG. 3 solely for ease of viewing other features of the microelectronic device structure 100 in those figures.

Each step contact 122 vertically extends through the insulative fill material(s) 406, through the stadium liner(s) (e.g., the second stadium liner 404, the first stadium liner 402), and through the insulative structure 104 of the step 120 to the conductive structure 106 associated with the step 120.

In some embodiments, the insulative fill material(s) 406 may be one or more dielectric material(s) formed of and including any one or more insulative materials described above. The first stadium liner 402 and the second stadium liner 404 may each be formed of and include a different one or more of the insulative materials described above. In some embodiments, the first stadium liner 402 comprises, consists essentially of, or consists of an oxide (e.g., silicon dioxide), and the second stadium liner 404 comprises, consists essentially of, or consists of a nitride (e.g., silicon nitride). The second stadium liner 404 may function as an "etch stop" material during formation of the step contacts 122, as described further below. The second stadium liner 404 may protect the first stadium liner 402 during formation of the conductive structures 106, as described further below.

Figure 5:
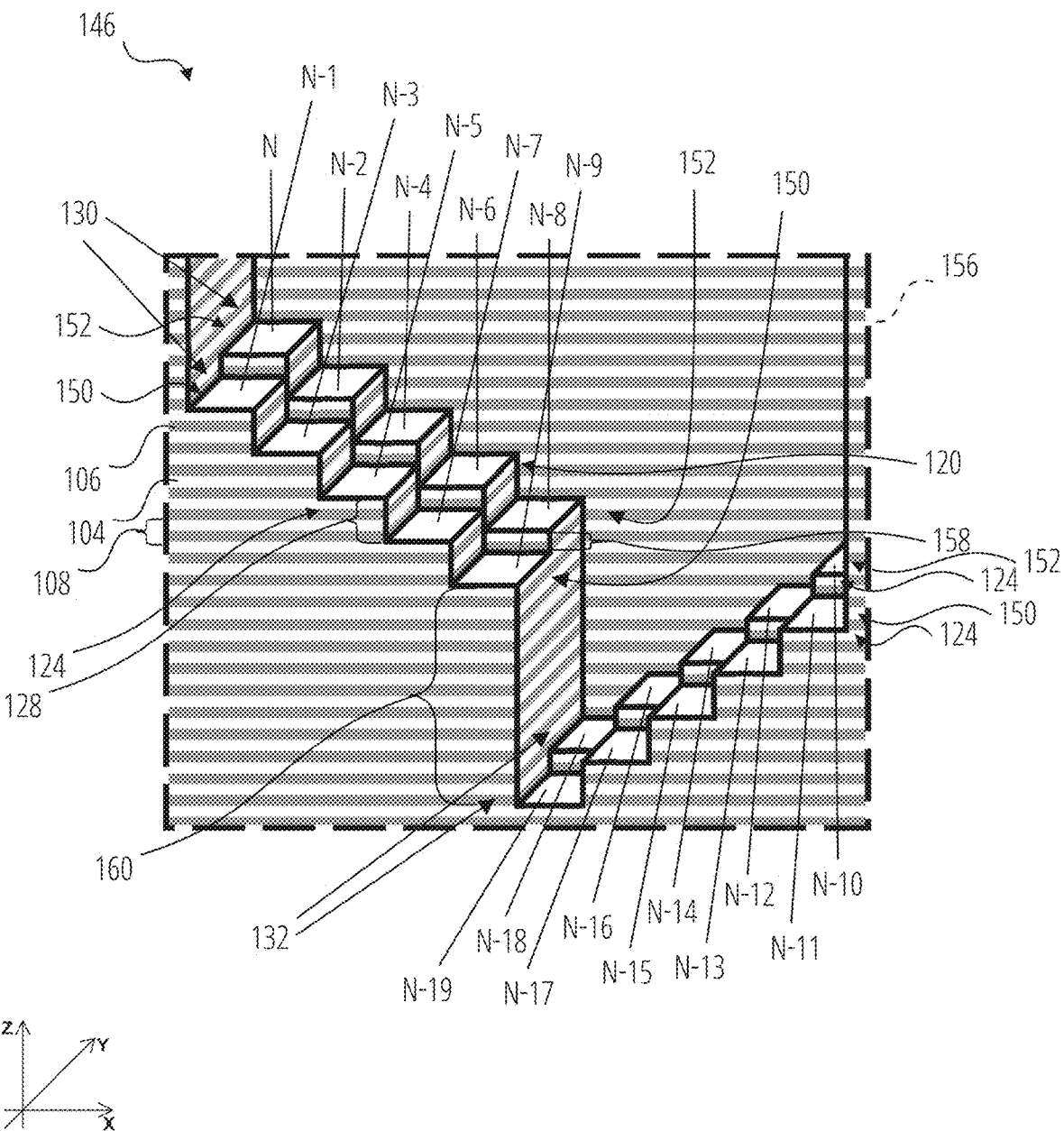
FIG. 5 is an enlarged view of the area of box 156 of FIG. 1, illustrating the steps of a multi-set stadium, according to embodiments of the disclosure.

With reference to FIG. 5, illustrated in enlarged view is the staircase profile of the multi-set stadium 146. The view of FIG. 5 corresponds to boxes 156 of FIG. 1, though without illustrating the step contacts 122, the stadium liners (e.g., the first stadium liner 402, the second stadium liner 404), and the fill material(s) 406 for better visibility of the staircase profile.

The multi-set stadium 146 includes at least two sets of staircases, with each set being substantially parallel to one another, such as with two sets of staircases provided by one upper staircase set 152 and one lower staircase set 150. Each set of staircases (e.g., the upper staircase set 152 and the lower staircase set 150) may include a single descending staircase 130 and single ascending staircase 132. In other embodiments, more than two sets of parallel staircases may be included, or each set may consist of only a single staircase (e.g., a single ascending staircase 132, a single descending staircase 130).

Each of the steps 120 of the staircases (e.g., of the upper staircase set 152, of the lower staircase set 150) of the multi-set stadium 146 may each occupy a unique tier elevation compared to the other steps 120 of the multi-set stadium 146. To accomplish this, the neighboring staircase sets (e.g., the upper staircase set 152, the lower staircase set 150) may be vertically offset from one another by at least a height of one tier 108 (e.g., the one-tier offset 158), as also illustrated in FIG. 5. Therefore, for the descending staircases 130, steps 120 at the elevations of N, N–2, N–4, N–6, and N–8 (e.g., in the descending staircase 130 of the upper staircase set 152) are each one tier 108 height above steps 120 at the elevations of N–1, N–3, N–5, N–7, and N–9, respectively (e.g., in the descending staircase 130 of the lower staircase set 150). Likewise, for the ascending staircases 132, steps 120 at the elevations of N–18, N–16, N–14, N–12, and N–10 (e.g., in the upper staircase set 152) are each one tier 108 height above steps 120 at the elevations of N–19, N–17, N–15, N–13, and N–11, respectively (e.g., in the lower staircase set 150).

Within each staircase, of each set of staircases (e.g., the upper staircase set 152, the lower staircase set 150), of an individual multi-set stadium 146, each step 120 may define the riser height 128, which may be selected to be greater than the vertical offset (e.g., the one-tier offset 158) between neighboring parallel staircase sets (e.g., the upper staircase set 152 and the lower staircase set 150). Each subsequent step 120 of each descending staircase 130 may be at an elevation that is a magnitude of the riser height 128 (e.g., two tiers 108) vertically lower than an elevation of its preceding step 120 (e.g., at elevations N, N–2, N–4, N–6, and N–8 for the descending staircase 130 of the upper staircase set 152; and at elevations N–1, N–3, N–5, N–7, and N–9 for the descending staircase 130 of the lower staircase set 150); and each subsequent step 120 of each ascending staircase 132 may be at an elevation that is the magnitude of the riser height 128 (e.g., the two tiers 108) vertically higher than an elevation of its preceding step 120 (e.g., at elevations N–18, N–16, N–14, N–12, and N–10 for the ascending staircase 132 of the upper staircase set 152; and at elevations N–19, N–17, N–15, N–13, and N–11 for the ascending staircase 132 of the lower staircase set 150). Moreover, the riser height 128 is selected so that the elevations of the steps 120 in one of the parallel sets of staircases (e.g., the upper staircase set 152 or the lower staircase set 150) of the multi-set stadium 146 is an elevation not occupied by steps 120 in another of the parallel sets of staircases. (e.g., the lower staircase set 150 or the upper staircase set 152, respectively).

In embodiments in which each staircase set includes both a descending staircase 130 and an ascending staircase 132, the descending staircase 130 may be offset from the ascending staircase 132 by a half-stadium offset 160, which may be a height of at least the number of tiers 108 in the elevationally lower staircases (e.g., the ascending staircases 132 in FIG. 5) of the staircases of the multi-set stadium 146. The half-stadium offset 160 ensures the steps 120 in the multi-set stadium 146 are each at unique tier elevations. For example, if—as in FIG. 5—each staircase includes five steps 120 with the riser height 128 of two tiers 108, then the descending staircase 130 may be vertically above or below the corresponding ascending staircase 132 of the set by the half-stadium offset 160 of at least ten tiers 108 (i.e., five steps 120×two tier 108 riser height 128 per step 120). Accordingly, the lowermost step 120 of the descending staircase 130 (e.g., the step 120 at elevation N–8 in the first descending staircase 130 and the step 120 at elevation N–9 in the second descending staircase 130) may be the riser height 128 lower than the uppermost step 120 of the corresponding ascending staircase 132 (e.g., the step 120 at elevation N–10 in the first ascending staircase 132 and the step 120 at elevation N–11 in the second ascending staircase 132). The lowest step 120 of the descending staircases 130 (e.g., the lowest step 120 of the second descending staircase 130, at elevation N–9) may be one tier above the uppermost step 120 of the ascending staircases 132 (e.g., the uppermost step 120 of the first ascending staircase 132, at elevation N–10).

In some embodiments, each set of parallel staircases (e.g., the upper staircase set 152, the lower staircase set 150) in the multi-set stadiums 146 may be provided by a single descending staircase 130 or single ascending staircase 132, rather than each staircase set including at least one descending staircase 130 and at least one ascending staircase 132 together. In such embodiments, the half-stadium offset 160 may be omitted.

With returned reference to FIG. 1 and FIG. 3, in some embodiments, each stadium 126 of a single block 110 may be structured as the multi-set stadium 146. In other embodiments, one or more other stadiums 126 of the block 110 may be structured differently, such as with only a single set of staircases. For example, as illustrated in FIG. 1, stadiums 126 in the fourth stadium areas 140 may include a single (e.g., only one) descending staircase 130 and a single (e.g., only one) ascending staircase 132. In some embodiments, the descending staircase 130 descends toward the ascending staircase 132, as illustrated in FIG. 1. In other embodiments, the ascending staircase 132 ascends toward the descending staircase 130 (such as if the illustrated lateral halves of the stadium 126 in the fourth stadium area 140 of FIG. 1 were horizontally reversed with one another). In other embodiments, one set of staircases consists of a single descending staircase 130 or a single ascending staircase 132 that extends the whole width of the stadium 126. In other embodiments, more than one descending staircase 130 may be included in the set, alone or with one or more ascending staircases 132; or more than one ascending staircase 132 may be included in the set, alone or with one or more descending staircases 130. Stadiums 126 with such a single set of staircases are referred to herein as "single-set stadiums" 148.

In single-set stadiums 148, each step 120 tread may span the whole length (Y-axis dimension) of the stadium 126 (e.g., the single-set stadium 148) from bridge 144 to bridge 144, as most easily seen in the top plan illustration of FIG. 3. The set of staircases defines a single row of steps 120 in the single-set stadium 148, and a single row of step contacts 122 may extend to the steps 120 of the single-set stadium 148, as illustrated in the bottom-most illustrated single-set stadium 148 of FIG. 3. Though not illustrated, for ease of viewing other features, the other single-set stadiums 148 may also include respective series of the step contacts 122.

Figure 6:
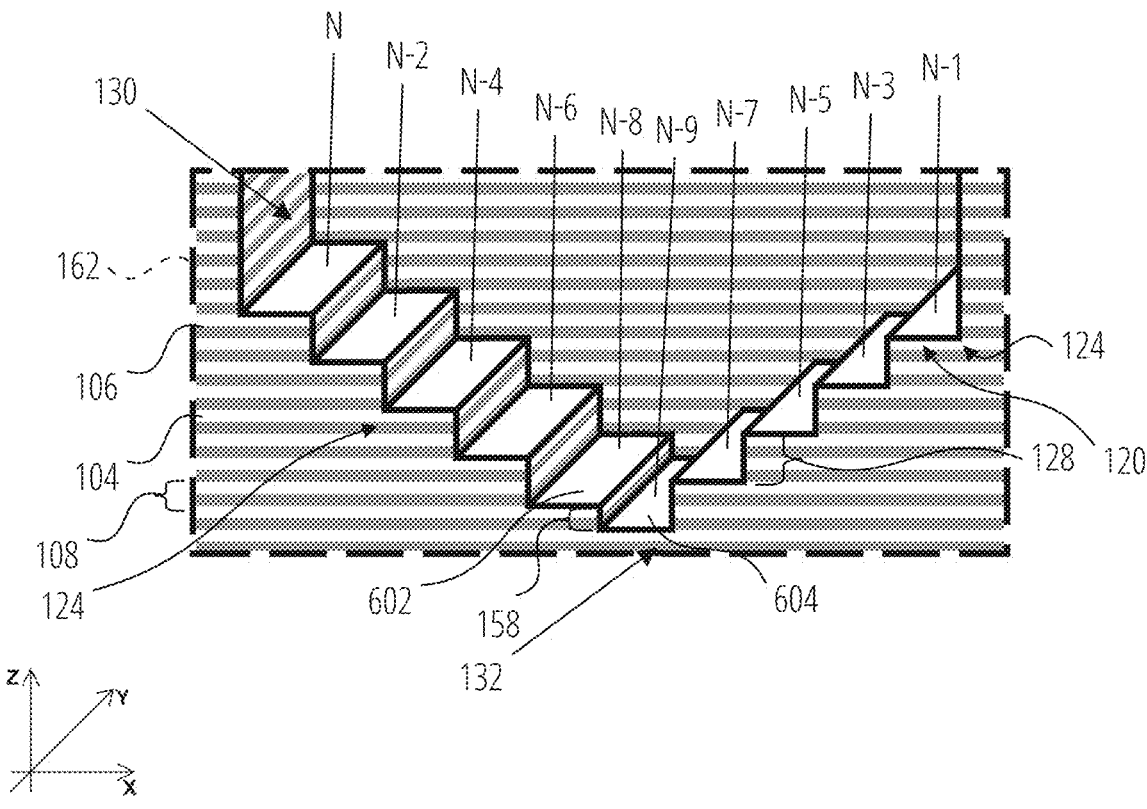
FIG. 6 is an enlarged view of the area of box 162 of FIG. 1, illustrating a single-set stadium, according to embodiments of the disclosure.

The staircase profile of the single-set stadium 148 is illustrated in an enlarged view of FIG. 6, which corresponds to box 162 of FIG. 1, though without illustrating the step contacts 122, the stadium liners (e.g., the first stadium liner 402 (FIG. 4), the second stadium liner 404 (FIG. 4), and the fill material(s) 406 (FIG. 4)) for better visibility. The single-set stadium 148 may include a single descending staircase 130 and a single ascending staircase 132 (collectively the single "set" of staircases of the single-set stadium 148) that together provide a series of steps 120 with each step 120 occupying a unique tier elevation.

Each of the steps 120 may define a same riser height 128, of a multiple number of the tiers 108 of the stack 102, within its respective staircase (e.g., within the descending staircase 130, within the ascending staircase 132). For example, in some embodiments, the riser height 128 may be selected to be a height of two tiers 108, and each subsequent step 120 of the descending staircase 130 may be at an elevation that is the riser height 128 of two tiers 108 (i.e., two conductive structures 106 plus two insulative structures 104) lower than its preceding step 120. Therefore, the descending staircase 130 defines steps 120 at elevations N, N–2, N–4, N–6, and N–8, as illustrated in FIG. 6. Within the same example, each subsequent step 120 of the ascending staircase 132 may be at an elevation that is the riser height 128 of two tiers 108 higher than its preceding step 120. Therefore, the ascending staircase 132 defines steps 120 at elevations N–9, N–7, N–5, N–3, and N–1.

The particular riser height 128 selected for the steps 120 of the single-set stadium 148 may be selected to be the same as the riser height 128 for the steps 120 in other stadiums 126 of the block 110, so that, in at least some embodiments, steps 120 of the various stadiums 126 may be substantially simultaneously patterned regardless of whether the steps 120 are for multi-set stadiums 146 or for single-set stadiums 148.

Within individual single-set stadiums 148, the vertical offset (e.g., the one-tier offset 158) from one staircase of a set (e.g., the descending staircase 130) to the other staircase of the set (e.g., the ascending staircase 132) may be substantially the same as the vertical offset (e.g., the one-tier offset 158) from one staircase set (e.g., the upper staircase set 152 (FIG. 5)) to its neighboring, parallel staircase set (e.g., the lower staircase set 150 (FIG. 5)). Having the same one-tier offset 158 in both types of stadiums may provide fabrication efficiencies and cost savings, as discussed in further detail below.

With continued reference to FIG. 6, to ensure the steps 120 of the descending staircase 130 of the single-set stadium 148 are at elevations unique from the elevations of the steps 120 of the ascending staircase 132 of the single-set stadium 148, the two staircases may be offset from one another by a number of tiers 108 that is less than the number of tiers 108 that define the riser height 128. For example, as in FIG. 6, in embodiments in which the riser height 128 is two tiers 108, the ascending staircase 132 may be offset (e.g., lower or higher) than the descending staircase 130 by the one-tier offset 158. Accordingly, the one-tier offset 158 from one staircase to the other (e.g., from the final step 602 of the descending staircase 130 to the initial step 604 of the ascending staircase 132) provides the unique step 120 elevations. In other embodiments, the offset may be a height of other than one tier 108, provided it is less than the riser height 128.

Though FIG. 6 and other figures illustrate the ascending staircase 132—of the single set of staircases in the single-set stadium 148—being the one-tier offset 158 lower than the descending staircase 130, the disclosure is not so limited. In other embodiments, the ascending staircase 132 may be one-tier offset 158 (or some other offset amount that is less than the riser height 128) higher than the descending staircase 130. In such embodiments, the ascending staircase 132 includes the "even elevation" steps 120, e.g., at elevations N, N–2, N–4, N–6, N–8, while the descending staircase 130 includes the "odd elevation" steps 120, e.g., at elevations N–1, N–3, N–5, N–7, N–9.

In the single-set stadiums 148, other than the one-tier offset 158 separating the elevations of the steps 120 that neighbor one another where the descending staircase 130 meets the ascending staircase 132 (e.g., the final step 602 of the descending staircase 130 and the initial step 604 of the ascending staircase 132), each other step 120 in the set of staircase differs in elevation from that of its neighboring steps 120 by the riser height 128 of the multiple (e.g., two) number of tiers 108. Accordingly, the step-to-step elevation difference within each respective staircase may be the same riser height 128 (e.g., two tiers 108), though the step-to-step elevation difference where neighboring staircases, of the set, meet may be other than the riser height 128 (e.g., may be the one-tier offset 158).

Though the figures, like FIG. 5 and FIG. 6, illustrate five steps 120 per staircase in each stadium 126, the disclosure is not so limited. Any other number (e.g., quantity) of steps 120 may be included in an individual staircase and in an individual staircase set. For example, an individual staircase may include six, seven, eight, or more than eight of the steps, and an individual staircase set may include twelve, fourteen, sixteen, or more than sixteen of the steps. In some embodiments, one or more individual staircase sets may include an odd number of steps 120, such that a descending staircase 130 may have one greater number of steps 120 than a corresponding ascending staircase 132, or vice versa. For an individual stadium 126, the number of steps 120 in the descending staircase 130 thereof may or may not be the same as the number of steps 120 in the ascending staircase 132 thereof.

With returned reference to FIG. 1, accurately forming the multi-set stadiums 146 and their relatively more complex and smaller-tread steps 120 may be challenging using conventional fabrication techniques, particularly for the relatively deeper stadiums 126 of the block 110 (e.g., the multi-set stadiums 146 in the first stadium area 134 and the third stadium area 138). For example, techniques involving patterning of the profiles of the upper staircase set 152 and the lower staircase set 150 in common upper elevations of the stack 102 before extending those profile patterns to final, extended depths may result in the step 120 edges between the upper staircase set 152 and the lower staircase set 150 shifting horizontally and/or becoming less sharp (e.g., more rounded) once the staircase profile is extended to the final stadium opening 154 depths. These fabrication defects may result in an insufficient step 120 area in the upper staircase set 152, which may inhibit effectively forming step contacts 122 to the conductive structures 106 associated with the steps 120 of the upper staircase sets 152.

Accordingly, the multi-set stadiums 146 may be formed by methods described herein that define the lower staircase set 150, distinct from the upper staircase set 152, once the multi-set stadium 146 has already been extended to substantially its final depths. These methods may therefore involve forming (e.g., etching) the lower staircase set 150 at the base of high-aspect-ratio openings (e.g., stadium openings 154), for at least the relatively deeper stadiums 126 (e.g., in the first stadium areas 134 and the third stadium areas 138). Because of the mirrored stadium structures of the blocks 110 of the mirrored blocks 302, a common mask opening may be used for the patterning of the lower staircase set 150 for each pair of mirrored blocks 302. The common mask opening may enable etching through a substantially larger mask opening than if individual mask openings were utilized for each individual lower staircase set 150 being formed. The larger mask opening may, therefore, facilitate a greater processing margin for accurate and precise fabrication of the steps 120 of the lower staircase set 150 while maintaining accurate and precise fabrication of the steps 120 of the upper staircase set 152 so that, subsequently, step contacts 122 may be accurately formed in electrical and physical contact with the conductive structures 106 associated with the steps 120.

Though FIG. 1 illustrates a relatively deepest multi-set stadium 146 in the first stadium area 134, a relatively shallowest multi-set stadium 146 in the second stadium area 136, a relatively second-deepest multi-set stadium 146 in the third stadium area 138, and a relatively deep single-set stadium 148 in the fourth stadium area 140, the disclosure is not so limited. For the multi-set stadiums 146 may be arranged in any other relative depth order in the block 110. As another example, the single-set stadium 148 (if included in the block 110) may be formed at any other depth in the stack 102 and at any other relative lateral position relative to the multi-set stadiums 146. Also, there may be one or more additional stadiums 126 disposed between the illustrated stadium areas (between the first stadium area 134 and the second stadium area 136, between the second stadium area 136 and the third stadium area 138, between the third stadium area 138 and the fourth stadium area 140), such as interrupting any area illustrated as a crest 142 or such as in the non-illustrated portion generally represented by intermediate region 164. Additionally or alternatively, one or more additional stadiums 126 may be disposed laterally adjacent to the first stadium area 134 and/or the fourth stadium area 140. Any such additional stadiums 126, whether interspersed with the stadiums 126 illustrated in FIG. 1 or adjacent to the stadiums 126 illustrated in FIG. 1, may be structured as the single-set stadiums 148, the multi-set stadiums 146, or as differently-structured stadiums, such with steps having a different riser height (e.g., a single-tier riser height) than the multi-tier riser height 128 in the single-set stadiums 148 and the multi-set stadiums 146. Any such additional stadiums 126 may also be within the elevations of the stack 102 as illustrated in FIG. 1 or within other elevations of the stack 102 not illustrated in FIG. 1, such as in higher-still elevations of the stack 102 formed over the illustrated tiers 108, or such as in lower-still elevations of the stack 102 formed between the illustrated tiers 108 and the base structure 114.

Figure 7:
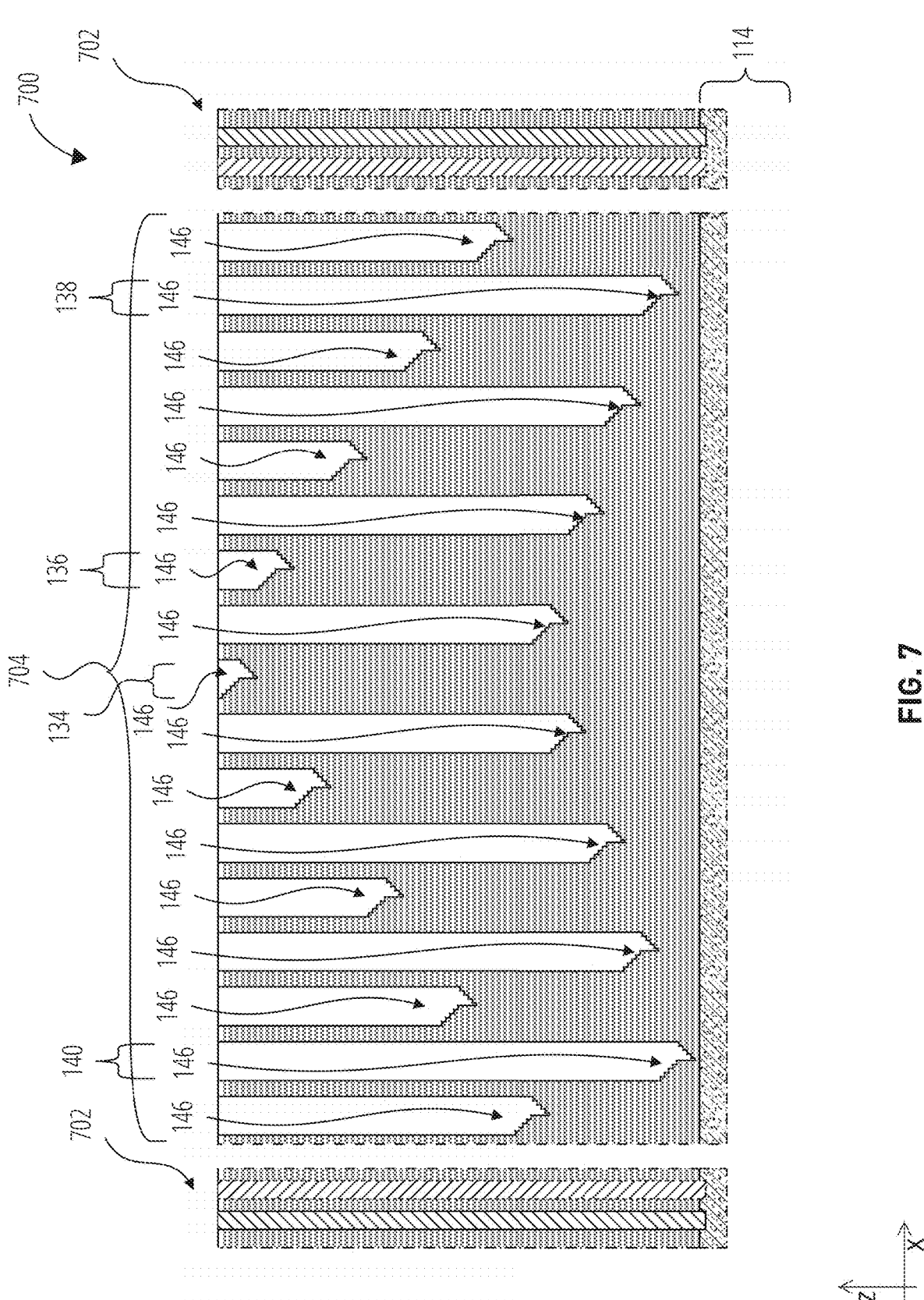
FIG. 7 is a schematic, cross-sectional, elevational, front view of a block of a microelectronic device structure and also a rear view of a mirrored block of the microelectronic device structure, which blocks may include the stadiums illustrated in FIG. 1, in accordance with embodiments of the disclosure.

In some embodiments, such as that illustrated in FIG. 7, a microelectronic device structure 700—which may include the stadiums 126 of the microelectronic device structure 100 of FIG. 1—may be fabricated and structured so that relatively deeper stadiums 126 (e.g., which may be structured as multi-set stadiums 146) alternate, across the width of the block 110 (FIG. 1) (e.g., across the width of a series 704 of stadiums 126), with relatively shallower stadiums 126 (e.g., which may also be structured as multi-set stadiums 146). Accordingly, the stadiums 126 may be substantially symmetrically distributed across the width of the series 704 of stadiums 126 (e.g., across the width of the block 110 (FIG. 1)) and between array portions 702 disposed to the lateral sides of the stadiums 126 series. The array portions 702 may include the aforementioned array(s) of pillars (e.g., including channel material and memory material) that extend through the stack 102 and effectuate the formation of strings of memory cells. In some embodiments, non-functional (e.g., so-called "dummy") pillars are also included in the array portions 702. For example, dummy pillars may be horizontally between the functional pillars (e.g., forming the strings of memory cells) and the stadiums 126.

Accordingly disclosed is a microelectronic device. The microelectronic device comprises a stack structure comprising a vertically alternating sequence of insulative structures and conductive structures arranged in tiers. Slit structures extend through the stack structure to divide the stack structure into blocks. A first series of stadiums is within the stack structure of a first block of a pair of the blocks. The first series of stadiums comprises at least one stadium comprising multiple parallel sets of staircases. A second series of stadiums is within the stack structure of a second block of the pair of blocks. The second series of stadiums comprises at least one additional stadium comprising additional multiple parallel sets of staircases. The additional multiple parallel sets of staircases (of the second series of stadiums) is mirrored across one of the slit structures to the multiple parallel sets of staircases (of the first series of stadiums). Conductive contact structures extend into steps of the staircases of the multiple parallel sets of staircases and of the additional multiple parallel sets of staircases. The steps comprise treads at upper surfaces of the insulative structures of the stack structure.

With reference to FIG. 8A through FIG. 17, illustrated are various stages of forming a microelectronic device, such as one including the microelectronic device structures 100 of one or more of FIG. 1 through FIG. 7.

Figure 8A:
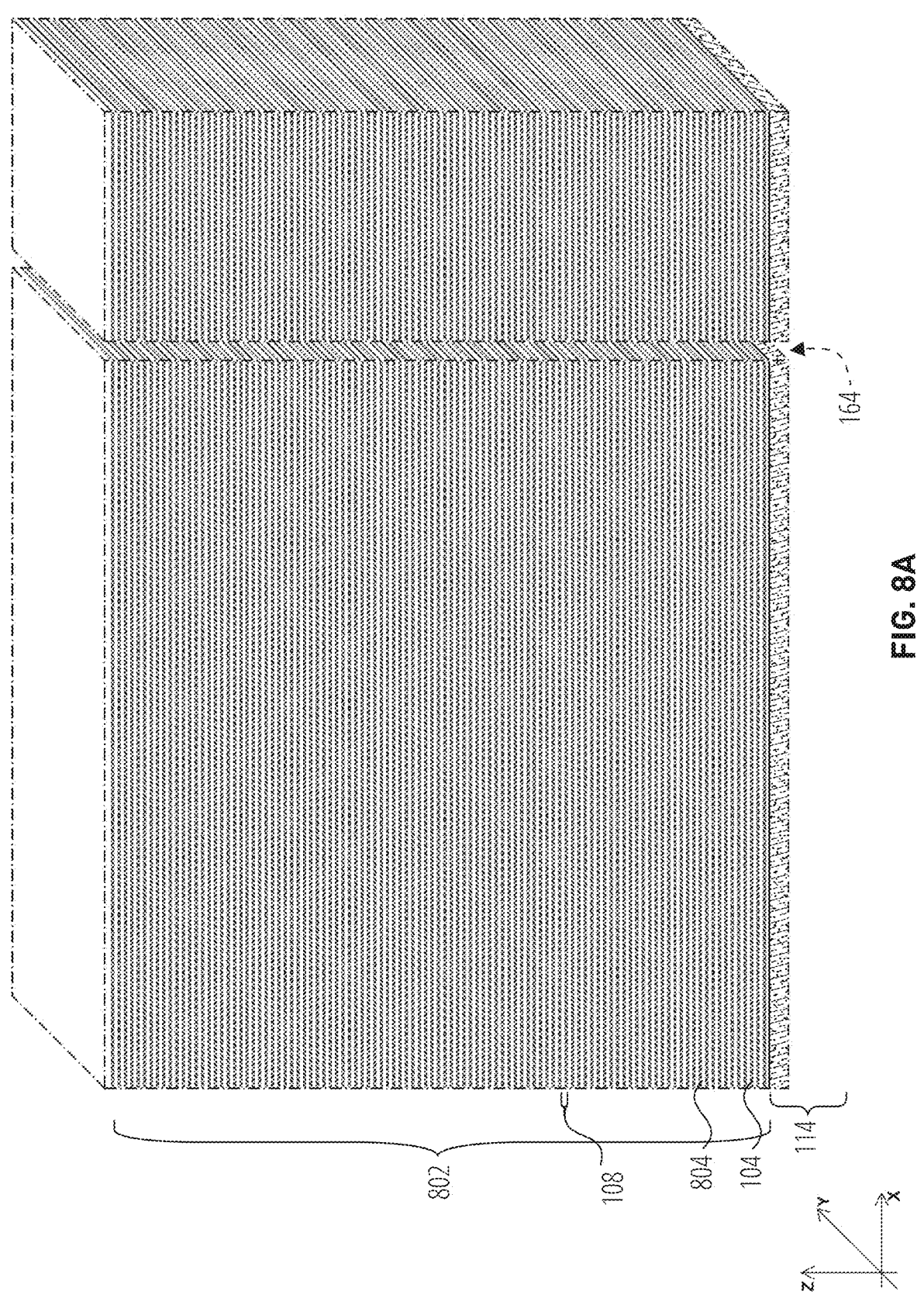
FIG. 8A through FIG. 17 are schematic views of various stages of processing to fabricate a microelectronic device, such as the microelectronic device(s) of FIG. 1 through FIG. 7, according to embodiments of the disclosure, wherein figures sharing a same numeral identifier may illustrate a same processing stage; wherein figures accompanied by an illustrated X-Y-Z axes symbol are cross-sectional perspective views corresponding to the view direction of FIG. 1 and section lines A-A in other figures; wherein figures accompanied by an illustrated Y-Z axes symbol are cross-sectional elevational views corresponding to the view direction of FIG. 4 and section lines B-B in other figures; and wherein figures accompanied by an illustrated X-Y axes symbol are plan views corresponding to the view direction of FIG. 3.
Figure 8B:
Figure 8B:
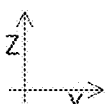

With particular reference to FIG. 8A and FIG. 8B, a stack 802 (otherwise referred to herein as a "stack structure" or "tiered stack") is formed on the base structure 114, including in areas (e.g., the first stadium area 134, the second stadium area 136, the third stadium area 138, and the fourth stadium area 140 previously described with reference to FIG. 1 and FIG. 3) in which the stadiums 126 (FIG. 1) will be formed.

In some embodiments, the stack 802 is formed to include a vertically alternating sequence of the insulative structures 104 and sacrificial structures 804 arranged in tiers 108. The sacrificial structures 804 may eventually be replaced with, or otherwise converted into, the conductive structures 106 (e.g., FIG. 1). In other embodiments, the stack 802 may be formed to include the conductive structures 106 instead of the sacrificial structures 804, even without replacement or conversion, such that the stack 802 may have substantially the materials of the stack 102 of FIG. 1. Accordingly, the stack 802 is formed to include the insulative structures 104 and "other structures," which other structures may be either the sacrificial structures 804 or the conductive structures 106.

To form the stack 802, formation (e.g., deposition) of the insulative structures 104 may be alternated with formation (e.g., deposition) of the other structures (e.g., the sacrificial structures 804). In some embodiments, the stack 802 is formed, at this stage, to include as many tiers 108 with the sacrificial structures 804 as there will be tiers 108 (FIG. 1) with conductive structures 106 (FIG. 1) in the final microelectronic device structure (e.g., the microelectronic device structure 100 (FIG. 1) and/or the microelectronic device structure 700 (FIG. 7)).

A relatively thicker upper insulative structure 806 may be included atop the stack 802 and may be formed of and include one or more insulative materials described above, such as the same insulative material(s) as the insulative structures 104 of the stack 802. One or more masks (e.g., hardmasks) may also be included on (e.g., above) the stack 802 (e.g., on the upper insulative structure 806) and utilized in subsequent material-removal (e.g., etching, patterning) processes.

Figure 9A:
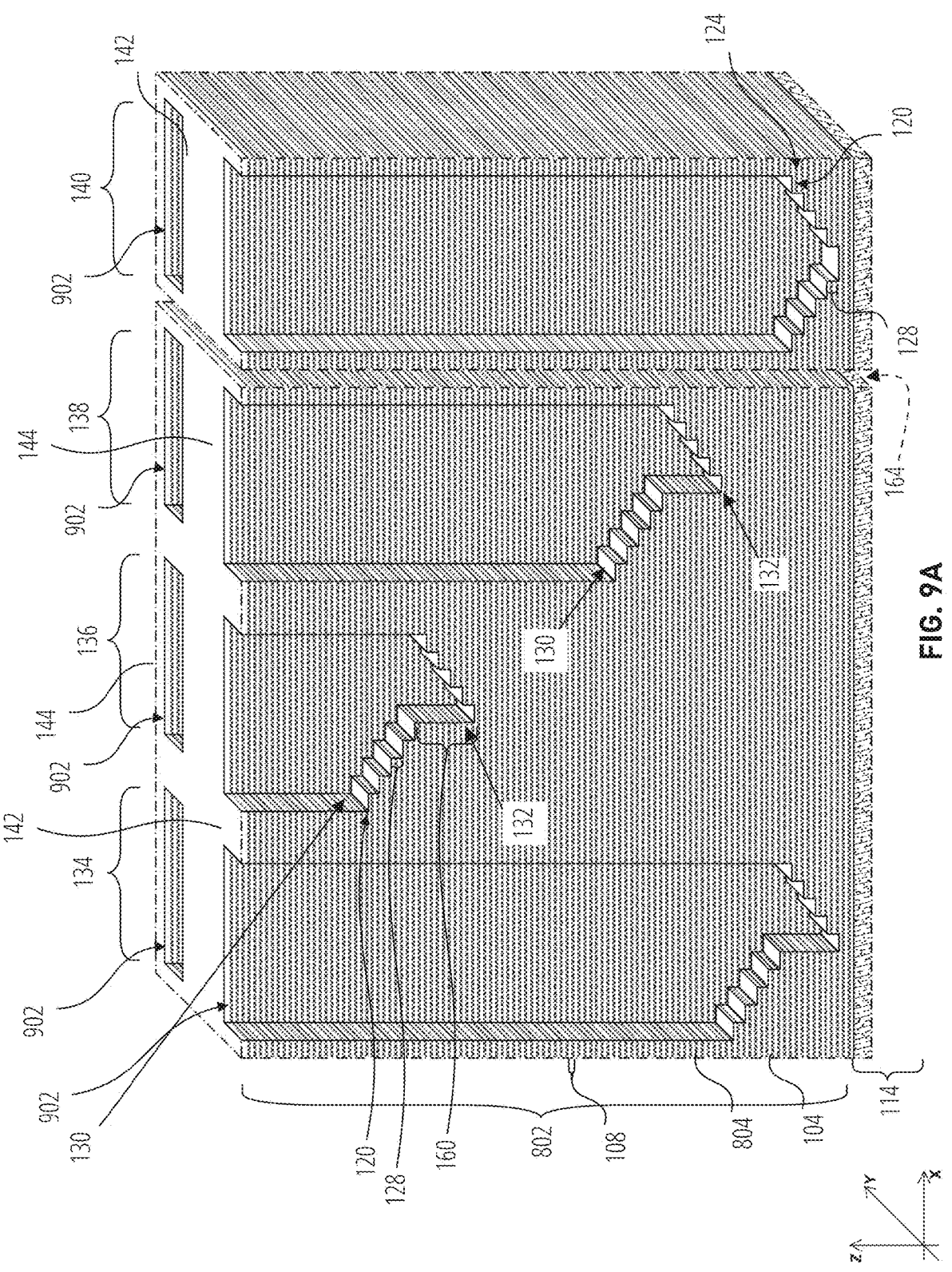
Figure 9B:
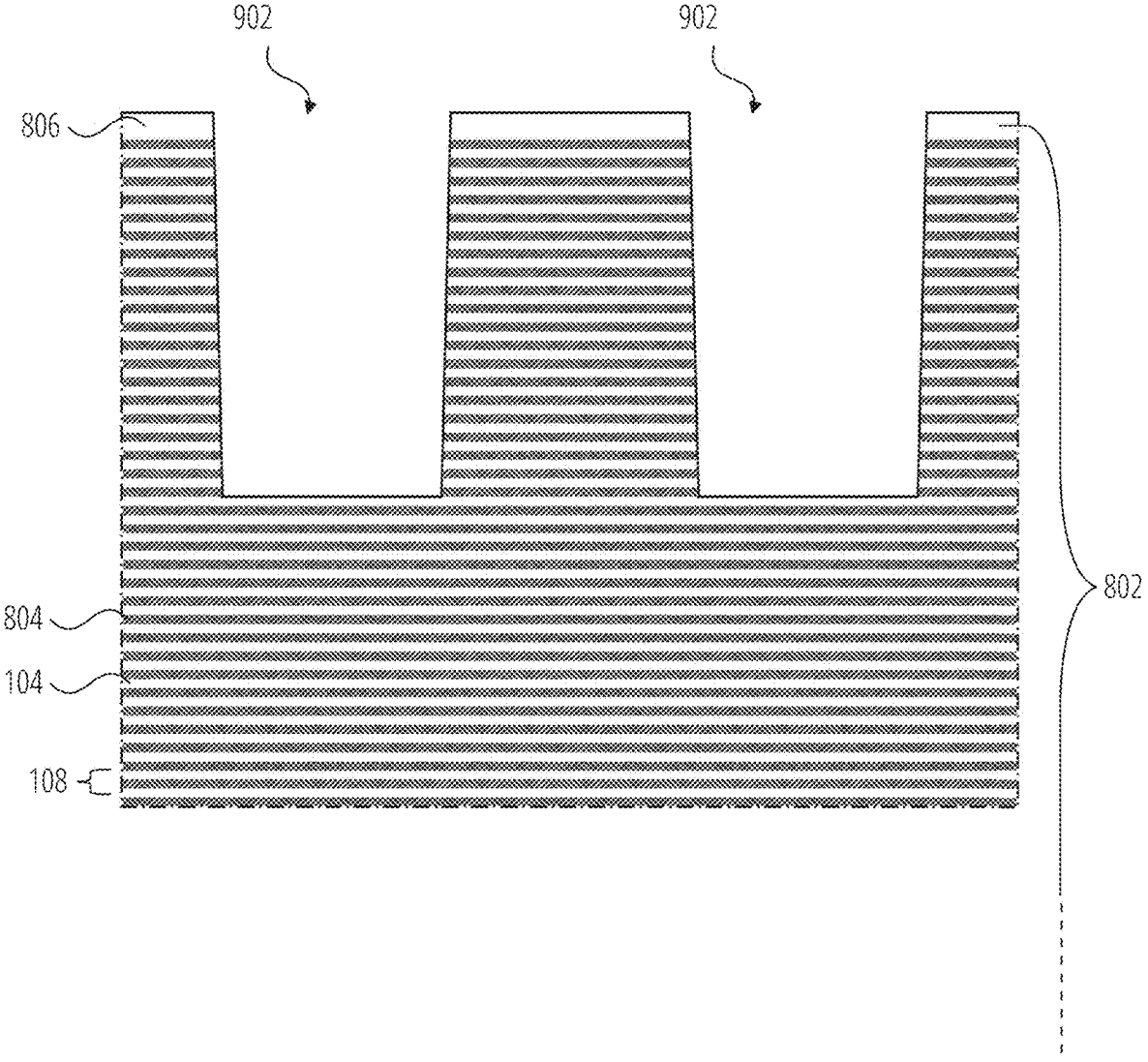

With reference to FIG. 9A and FIG. 9B, the stack 802 (and the upper insulative structure 806 and mask, if present) may be patterned (e.g., etched) to form, in each stadium area for a multi-set stadium 146 (FIG. 1), a single set of staircases with a profile matching that of the upper staircase set 152 (FIG. 5) to be formed for the respective multi-set stadium 146 (FIG. 5). In some embodiments, the single set of staircases may be formed in a common elevation group for each of the multi-set stadiums 146 (e.g., in the first stadium area 134, the second stadium area 136, and the third stadium area 138) before subsequently extending the depth of the single set of staircases to the ultimate depths of the upper staircase sets 152 (FIG. 5). Accordingly, the single set of staircases having the profile of the upper staircase set 152 (FIG. 5) is formed at the base of each of final-depth stadium openings 902.

Before, concurrent with, or subsequent to forming the final-depth stadium openings 902 in the stadium areas for the multi-set stadiums 146 (FIG. 1) (e.g., in the first stadium areas 134, the second stadium areas 136, and the third stadium areas 138), the single set of staircases for the single-set stadium 148 (FIG. 6) may be formed in the stadium areas (e.g., the fourth stadium areas 140) for the single-set stadiums 148 (FIG. 6), except that the descending staircase 130 and the ascending staircase 132 may mirror one another and be formed in the tier 108 elevations for the intended elevationally higher of the staircases. For example, for a single-set stadium 148 (FIG. 6) to be formed with a descending staircase 130 vertically offset above an ascending staircase 132, as in FIG. 6, the final-depth stadium opening 902 for the single-set stadium 148 (FIG. 6) may be at the elevations of the descending staircase 130 in the stage illustrated in FIG. 9A and FIG. 9B. Accordingly, at this stage, the neither of the mirrored staircases for the single-set stadium 148 (FIG. 6) are vertically offset from one another.

Concurrently with forming the final-depth stadium openings 902, areas of the stack 802 for the crests 142 (FIG. 1) and the bridges 144 (FIG. 1) may not be etched so that these portions of the stack 802 retain the full, initial height of the stack 802.

Figure 10A:
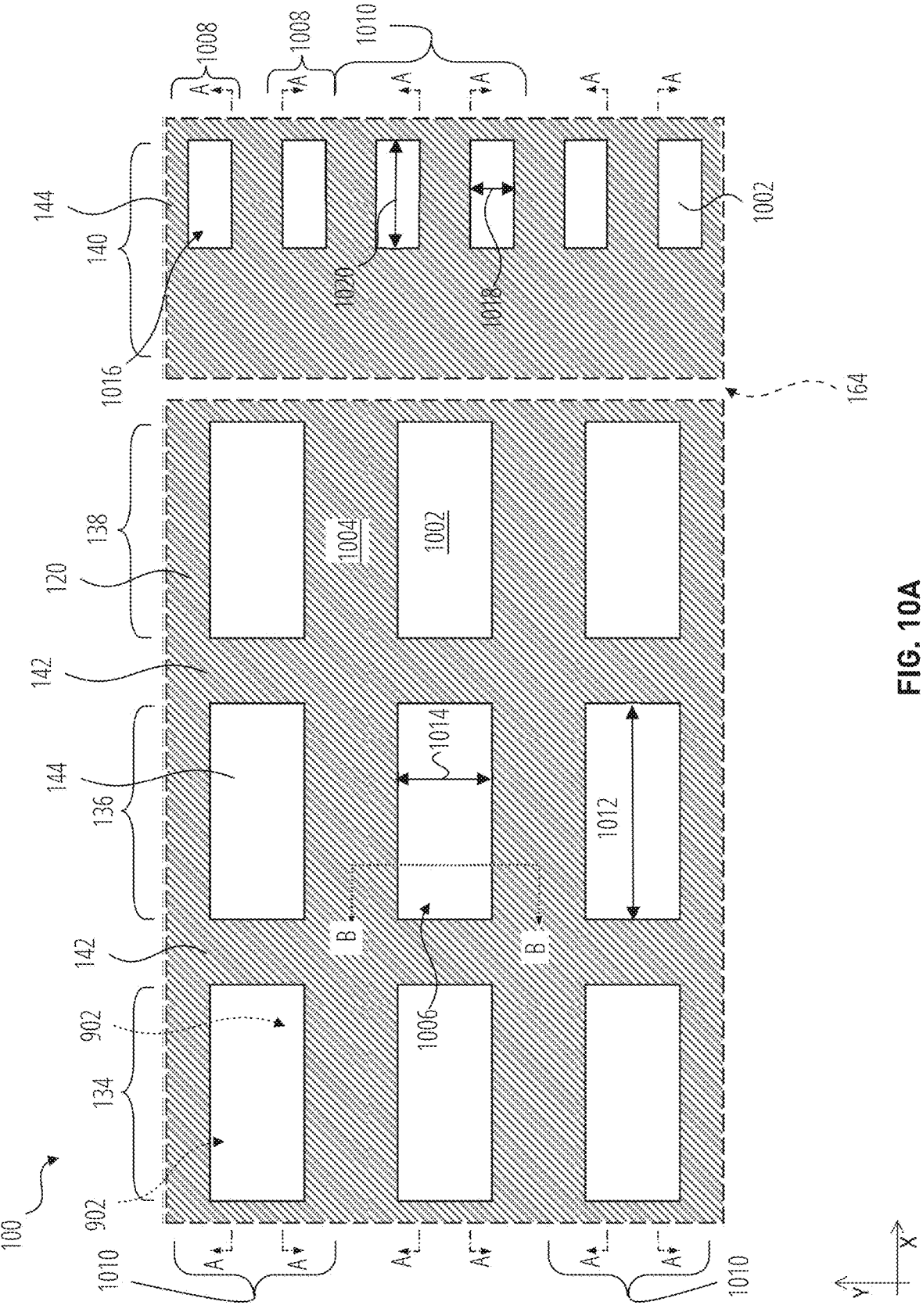
Figure 10B:
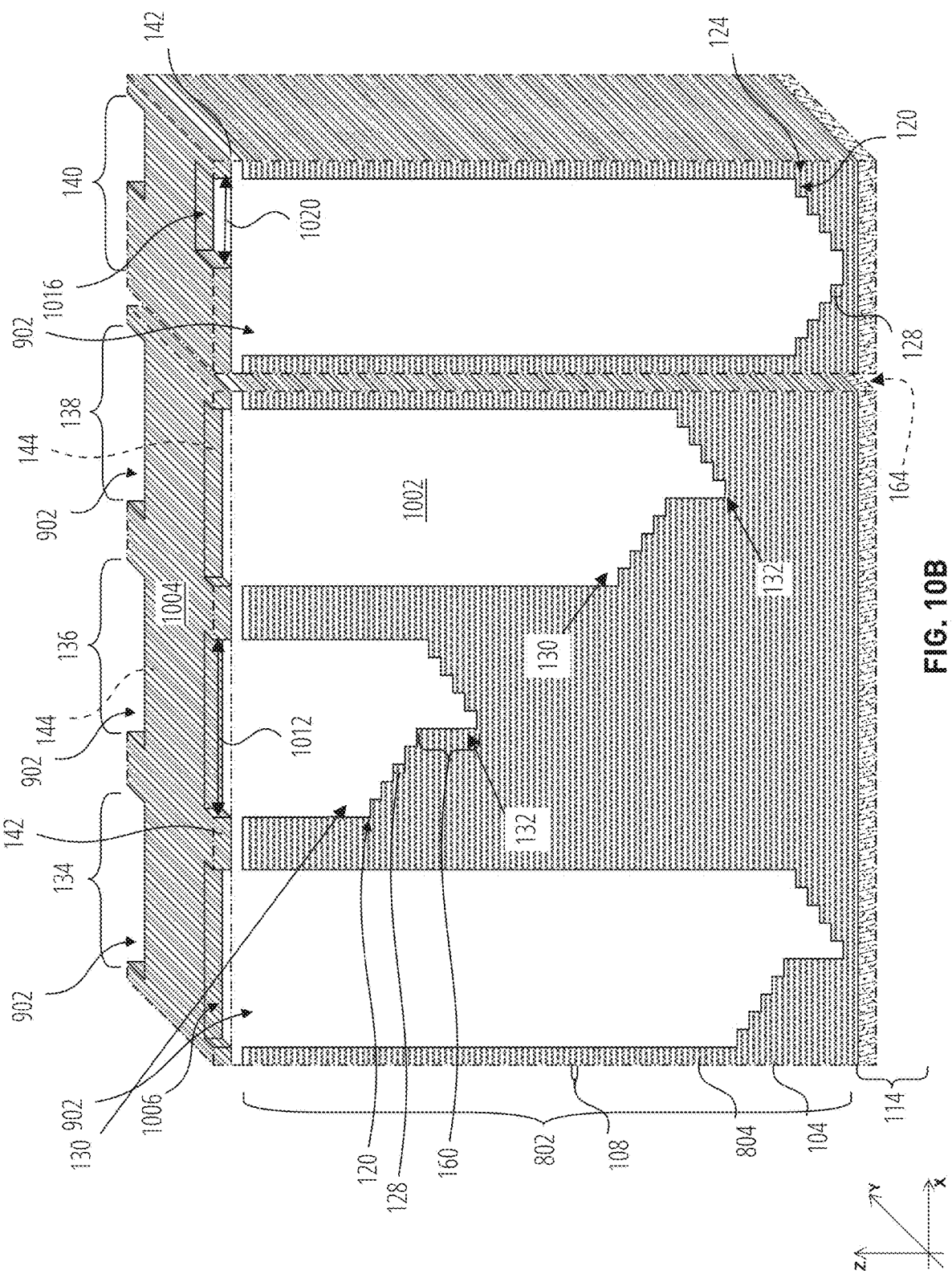
Figure 10C:
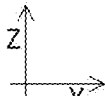

With reference to FIG. 10A, FIG. 10B, and FIG. 10C, one or more resist materials 1002 may be formed (or re-formed), such as by deposition of the resist material 1002, to substantially fill and/or overfill the final-depth stadium openings 902. In some embodiments, the resist material 1002 is formed to extend over and above the upper insulative structure 806, as illustrated in FIG. 10C. In other embodiments, an upper surface of the upper insulative structure 806 may be substantially coplanar with an upper surface of the resist material 1002.

A mask 1004 is formed (or re-formed), such as by deposition of the mask 1004, on the resist material 1002. The mask 1004 is patterned (e.g., etched) to define a common mask opening 1006 for each pair of multi-set stadiums 146 (FIG. 1) to be formed in block areas 1008 of a mirrored block area 1010 (e.g., areas in which mirrored, multi-set stadiums 146 (FIG. 4) are to be formed). The mask opening 1006 may have at least a width 1012 of the multi-set stadium 146 (FIG. 3) to be formed. The mask opening 1006 may also have a length 1014 extending the length of about half a first multi-set stadium 146 (FIG. 3) to be formed, the length of the intervening non-patterned area of the stack 802, and the length of about half a second multi-set stadium 146 (FIG. 3) to be formed with a mirrored structure to the first multi-set stadium 146 (FIG. 3).

Accordingly, each mask opening 1006 may expose at least the longitudinal areas that are to include the lower staircase sets 150 (FIG. 5) of a pair of mirrored multi-set stadiums 146 (FIG. 5). The length 1014 of the mask opening 1006— shared for both block areas 1008 within each mirrored block area 1010—may, therefore, be significantly greater than if the mask 1004 were patterned with individual openings for each block area 1008. In some embodiments, the length 1014 of each mask opening 1006 may be at least the length of two longitudinal halves of the multi-set stadiums 146 (FIG. 5) to be formed, plus the length of two bridges 144 (FIG. 1), and the length of the slit structure 116 (FIG. 1) that will be between mirrored blocks 302 (FIG. 3).

In some embodiments, concurrent with the formation of the mask openings 1006 for the multi-set stadiums 146 (FIG. 1), the mask 1004 may also be patterned (e.g., etched) to form additional mask openings 1016 in the stadium areas (e.g., the fourth stadium areas 140) for the single-set stadiums 148 (FIG. 6) to be formed. The additional mask openings 1016 may each have a length 1018 of about the length of the single-set stadium 148 (FIG. 6) to be formed. The additional mask openings 1016 may each have a width 1020 of about one lateral half of the single-set stadium 148 (FIG. 6) to be formed.

Figure 11A:
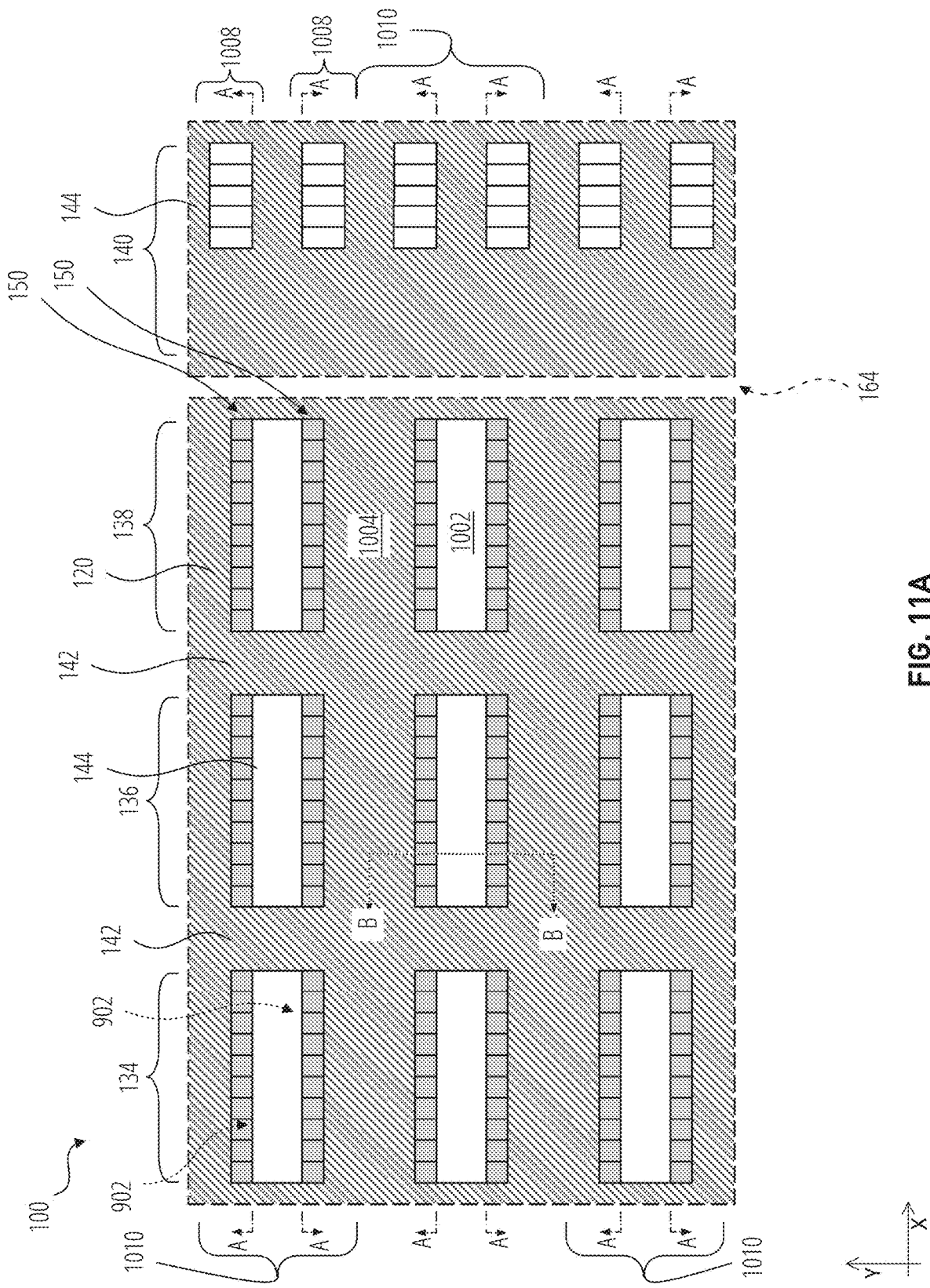
Figure 11B:
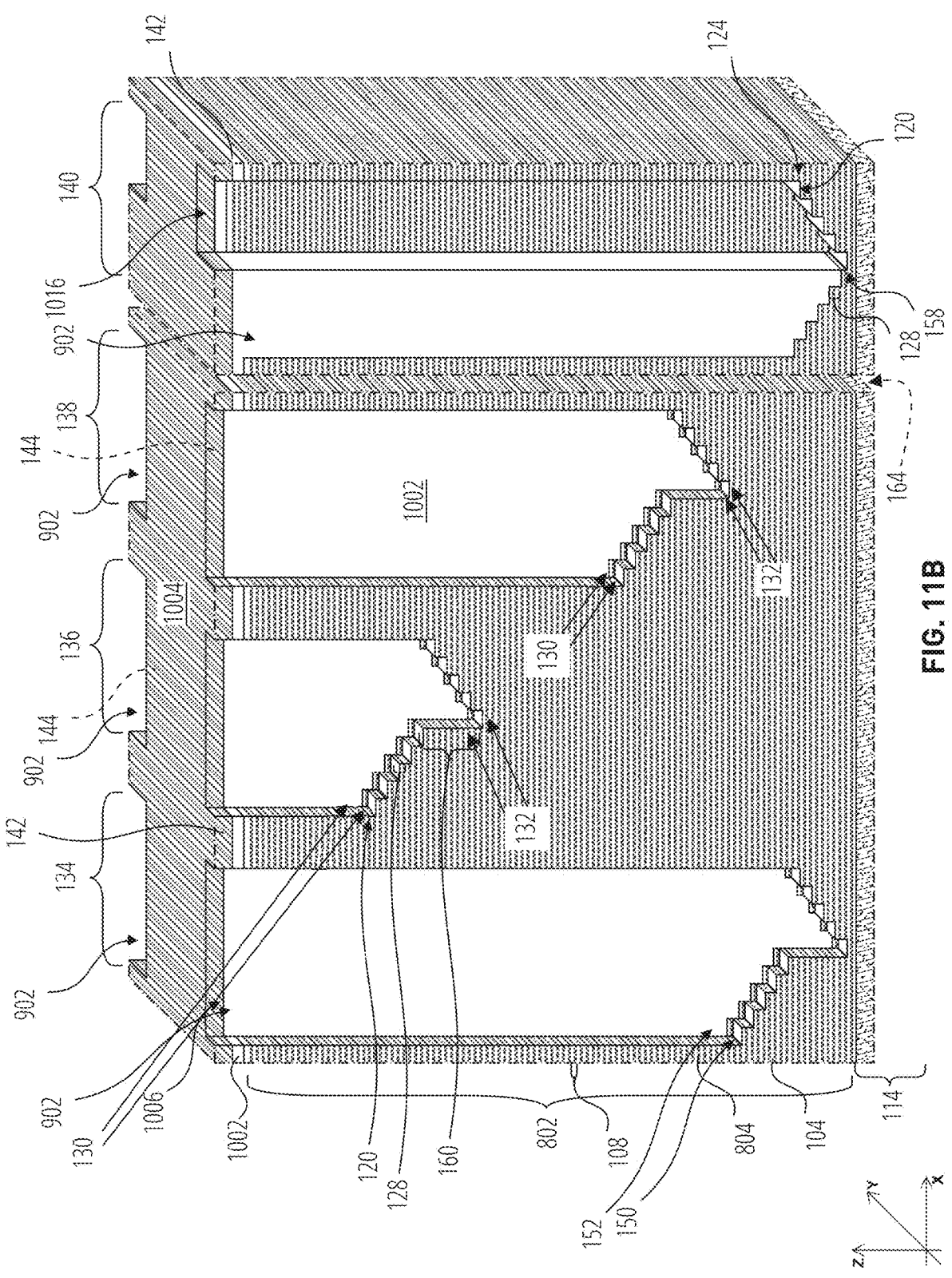
Figure 11C:
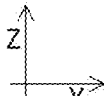

With reference to FIG. 11A, FIG. 11B, and FIG. 11C, the mask openings 1006 may then be used to pattern (e.g., etch) the resist material 1002 and then the underlying stack 802 structures to form the lower staircase set 150 vertically offset from the upper staircase set 152 (e.g., by the one-tier offset 158 (FIG. 5)). During this process, the resist material 1002 may protect (e.g., cover) the upper staircase set 152, as illustrated in FIG. 11C.

In some embodiments, as illustrated in FIG. 11C, etching the stack 802 materials to form the lower staircase set 150 at the base of the final-depth stadium opening 902 may result in the resist material 1002 tapering in horizontal dimension along the height of the final-depth stadium opening 902. Accordingly, the length 1014 of the mask opening 1006 may be selected or otherwise configured to ensure that a resulting step length 1102 for the lower staircase set 150 is about equal to the step length for the upper staircase set 152. The relatively greater length 1014 of the mask opening 1006, facilitated by using a common mask opening 1006 for each mirrored block area 1010, may also enable a relatively more precise and relatively more accurate etching at the base of high-aspect-ratio stadium openings (e.g., final-depth stadium openings 902), even with a tapering resist material 1002 along the sidewall of the final-depth stadium openings 902.

The one-tier etching to form the lower staircase set 150, vertically offset from the upper staircase set 152, may complete the formation of the staircase profile of the multi-set stadiums 146 (FIG. 5) at their final depths, without need for a subsequent extension of the staircase profile(s) to greater depths in the stack 802. Accordingly, once the lower staircase set 150 if formed, its step 120 shape and positions may be substantially final, avoiding the chance of step 120 edges shifting or becoming curved or otherwise less distinctive as may otherwise result had subsequent extension of the staircase profile(s) to greater depths been needed.

Because a common one of the mask openings 1006 is used to simultaneously etch the lower staircase sets 150 in each of the block areas 1008 of a mirrored block area 1010, the etching process may also remove some or substantially all of the resist material 1002 in an intermediate area 1104 between the pair of final-depth stadium openings 902. The thickness to which the resist material 1002 was formed and/or the thickness of the upper insulative structure 806 may have been selected or otherwise tailored to ensure that the one-tier etching to form the lower staircase sets 150 does not substantially decrease the height of the stack 802 in the intermediate area 1104.

In some embodiments, concurrent with forming the lower staircase sets 150 for the multi-set stadiums 146 (FIG. 5), the one-tier offset 158 between the descending staircase 130 and the ascending staircase 132 of the single-set stadium 148 (FIG. 6) may also be formed via the additional mask openings 1016. This concurrent formation is facilitated in embodiments in which the lower staircase set 150 is vertically offset from the upper staircase set 152 of the multi-set stadiums 146 (FIG. 5) by a same vertical offset (e.g., the one-tier offset 158) as the descending staircase 130 is vertically offset from the ascending staircase 132 of the single-set stadiums 148 (FIG. 6).

Figure 12A:
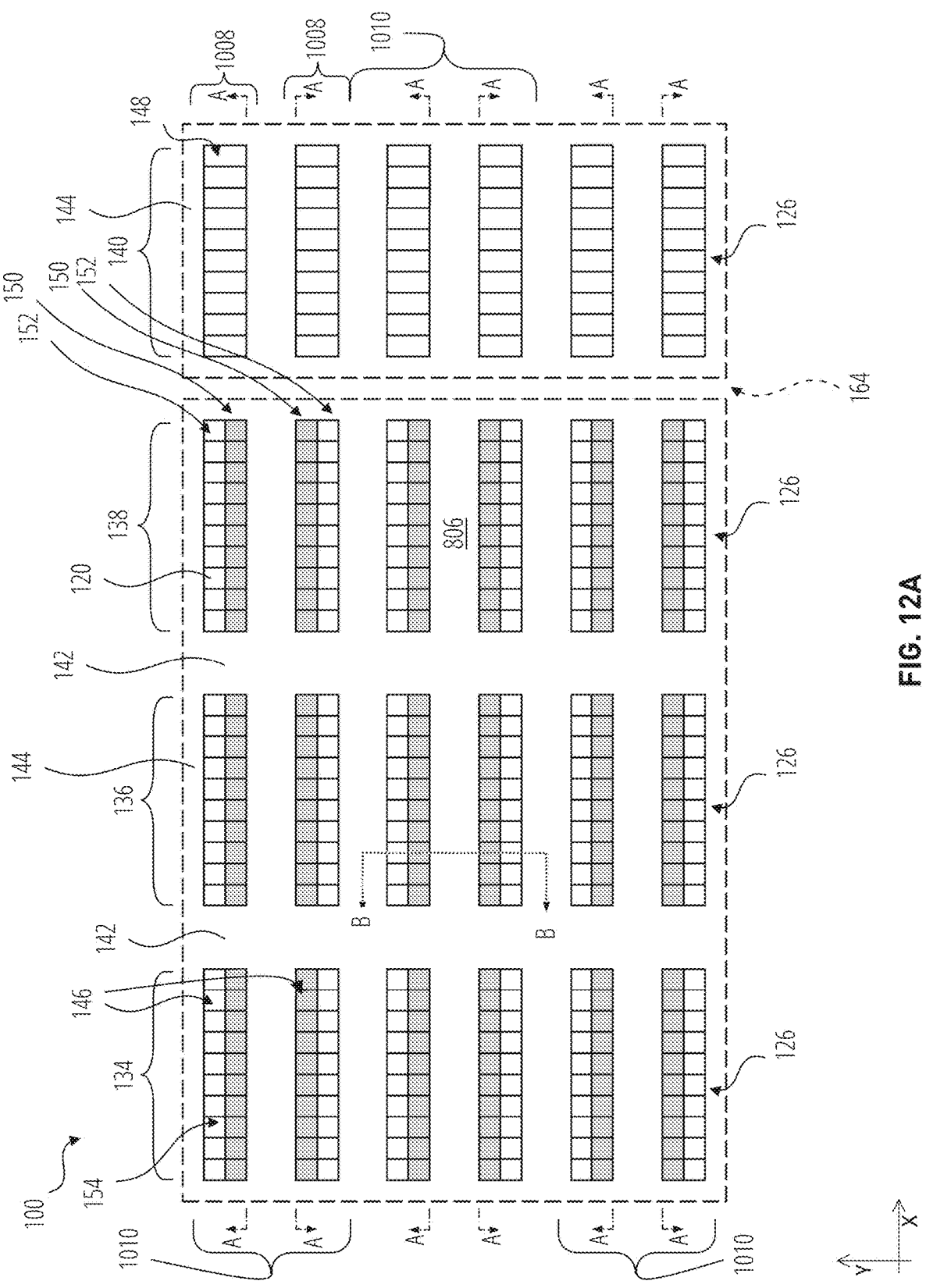
Figure 12B:
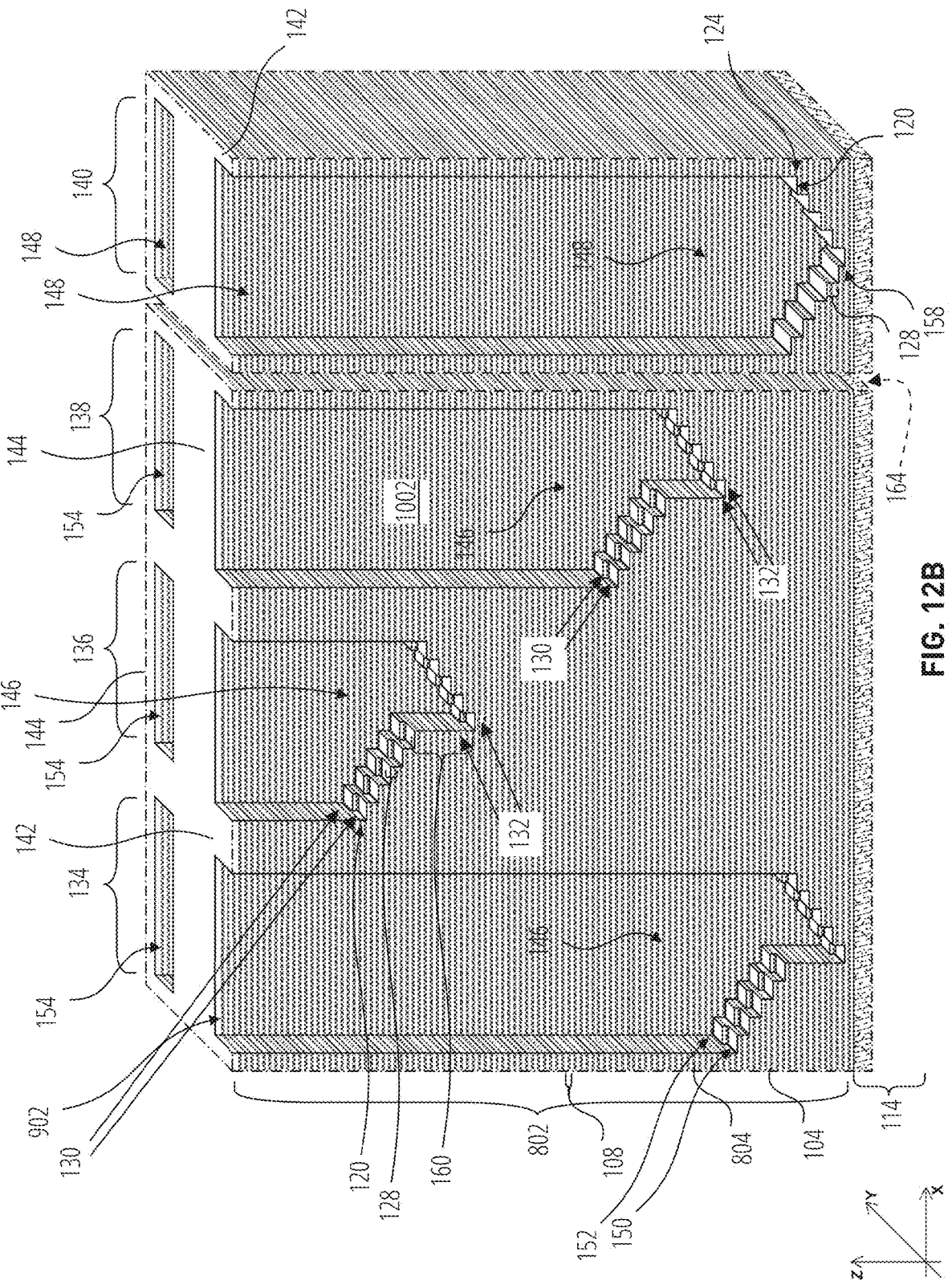
Figure 12C:
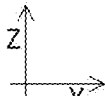

After completing the formation of the multi-set stadiums 146 (FIG. 5) and the single-set stadiums 148 (FIG. 6) (if any), the resist material 1002 and the mask 1004 may be removed, forming the structures of FIG. 12A, FIG. 12B, and FIG. 12C with the completed staircase profiles at their final depths. As illustrated in FIG. 12C, in each mirrored block area 1010, the step 120 elevations in one block area 1008 mirror those in the longitudinally neighboring block area 1008.

Figure 13A:
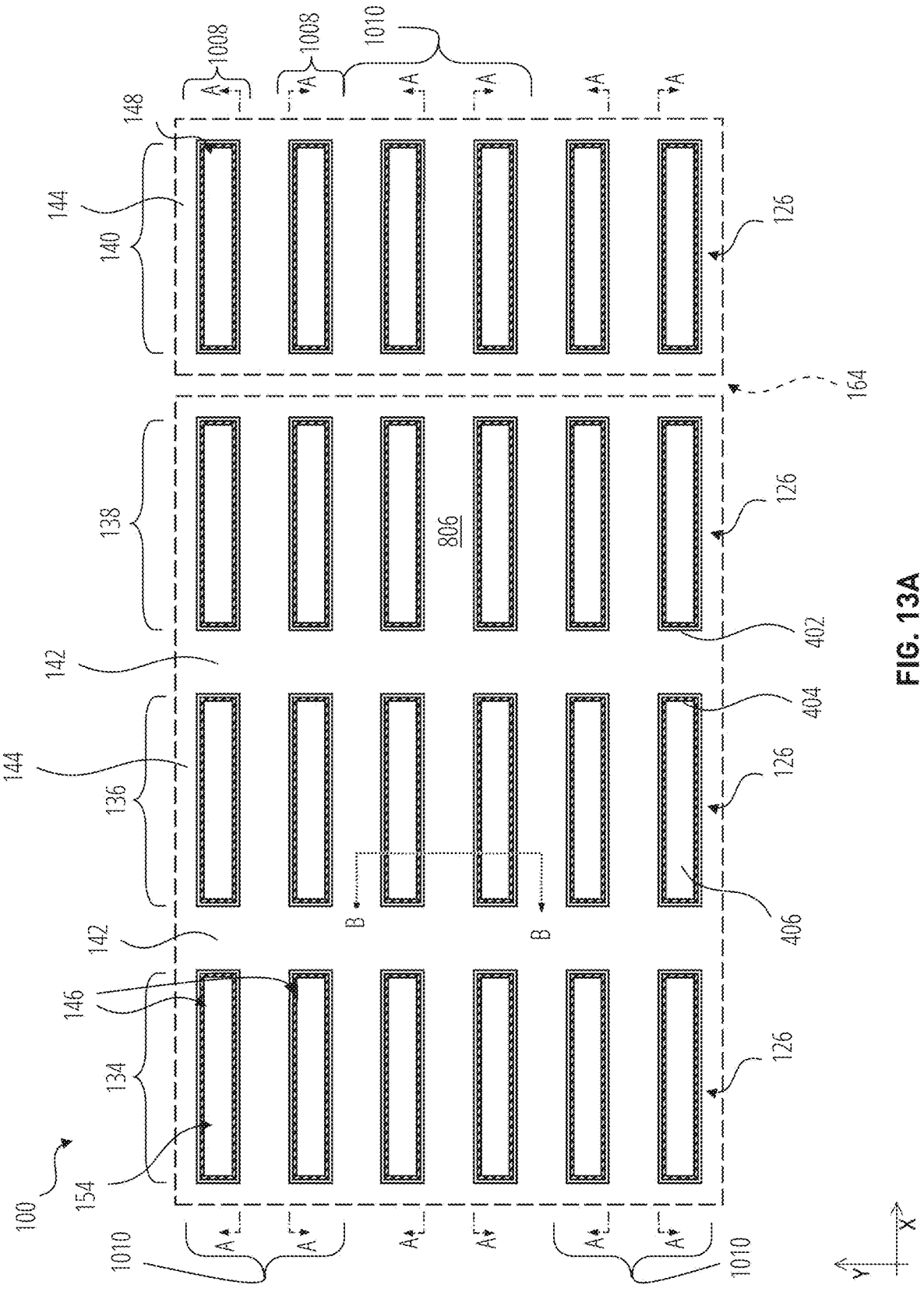
Figure 13B:
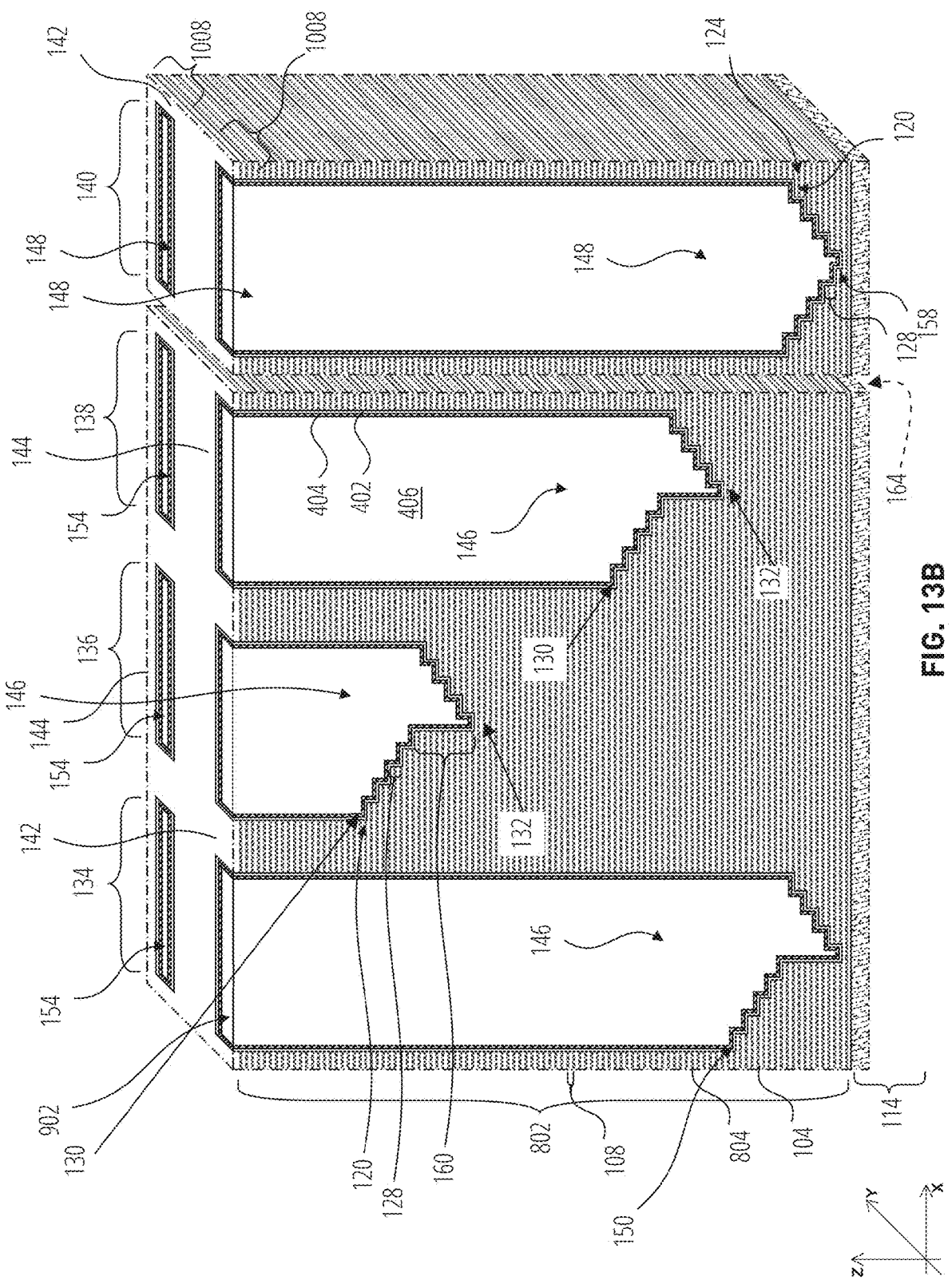
Figure 13C:
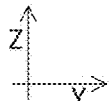

With reference to FIG. 13A, FIG. 13B, and FIG. 13C, the stadium liner(s) may be formed in each of the stadium openings 154. In some embodiments, the first stadium liner 402 is formed (e.g., conformally deposited) on the steps 120 and sidewalls bordering the stadium openings 154, and the second stadium liner 404 is formed (e.g., conformally deposited) on the first stadium liner 402.

One or more fill materials 406 may be formed (e.g., deposited) on the stadium liner(s) (e.g., on the second stadium liner 404) to substantially fill the remaining space of the stadium openings 154.

Figure 14A:
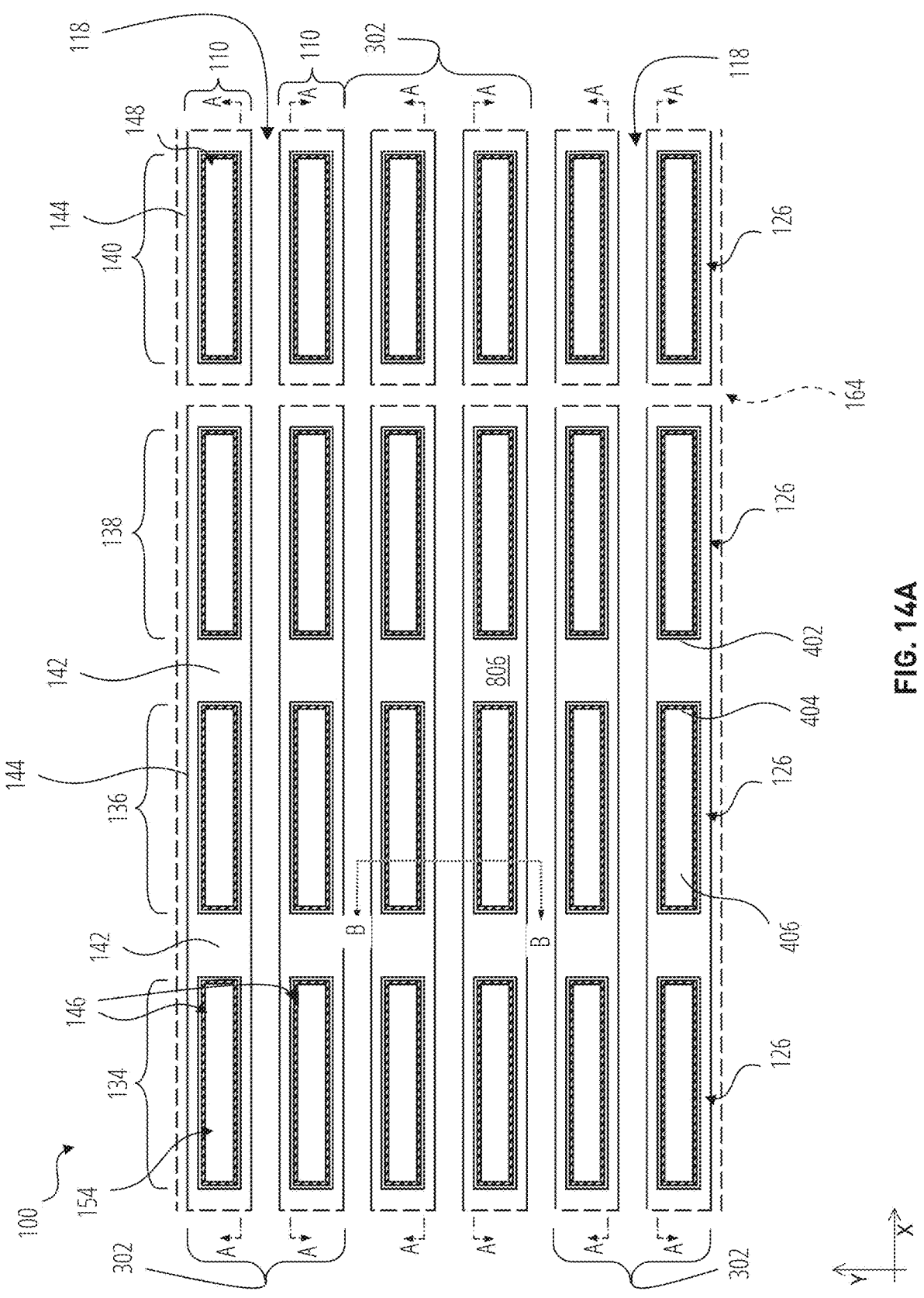
Figure 14B:
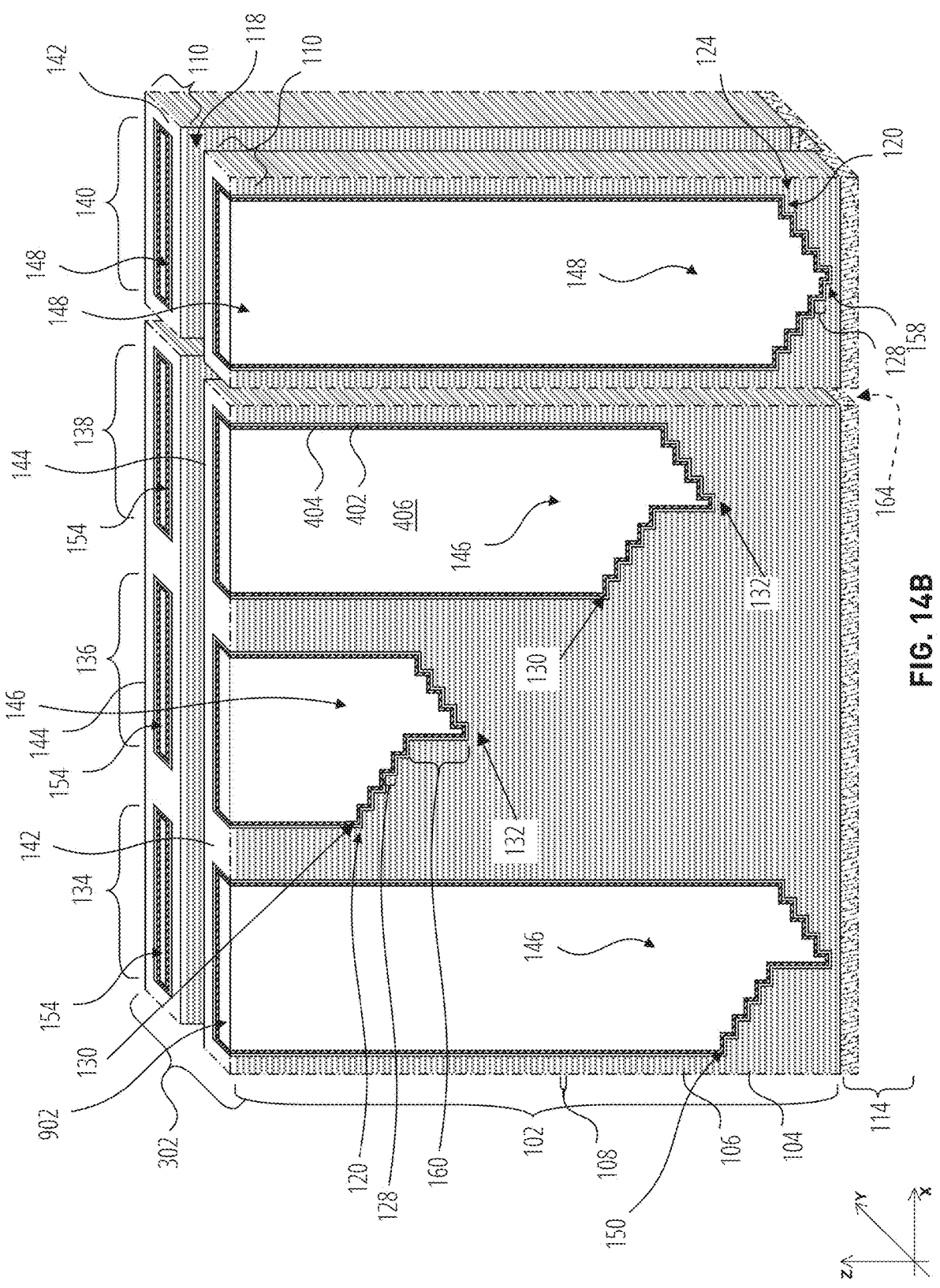
Figure 14C:
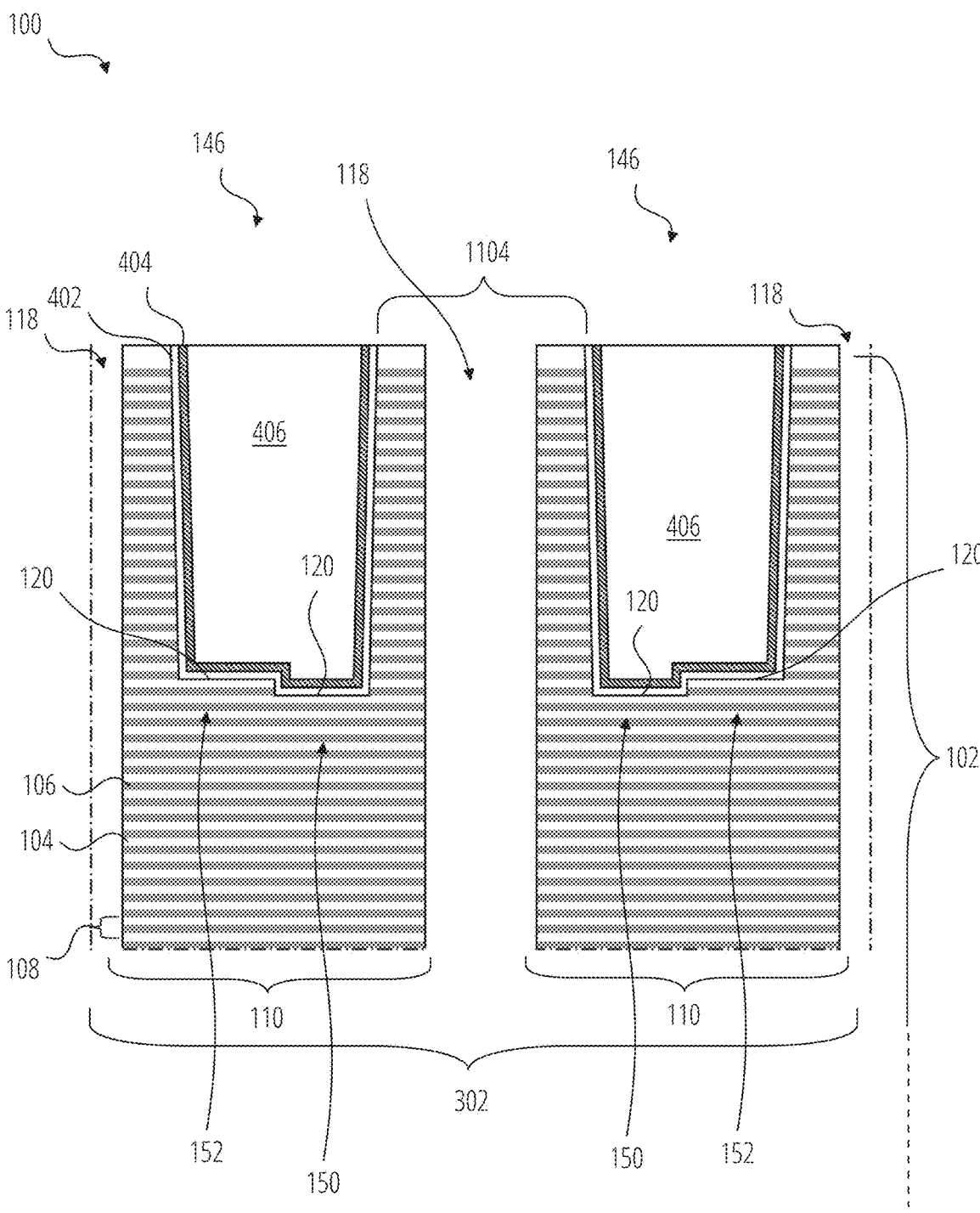

With reference to FIG. 14A, FIG. 14B, and FIG. 14C, the slits 118 may be formed (e.g., etched) through a whole height of the stack 802 (FIG. 13B) to divide the stack 802 into the blocks 110. Forming the slits 118 also defines the bridges 144 along the front and rear sides of the stadiums 126.

In embodiments in which the stack 802 (FIG. 8A) was formed to include sacrificial structures 804 (FIG. 8A) that are not yet configured as the insulative structures 104, the sacrificial structures 804 may be substantially removed (e.g., exhumed)—by way of the slits 118—without substantially removing the insulative structures 104 or the first stadium liner 402. Removing the sacrificial structures 804 leaves voids where each sacrificial structures 804, and the conductive material(s) of the conductive structures 106 may then be formed in those voids to form the conductive structures 106 in substantially the same elevations and positions as occupied by the sacrificial structures 804.

In other embodiments, the sacrificial structures 804 (FIG. 13B) are not substantially removed, but are chemically converted to form the conductive material(s) of the conductive structures 106.

Accordingly, whether formed in voids after reviewing the sacrificial structures 804 (FIG. 13B) or after chemically converting the sacrificial structures 804, the stack 102 is formed with insulative structures 104 vertically interleaved with conductive structures 106 and arranged in the tiers 108.

Figure 15A:
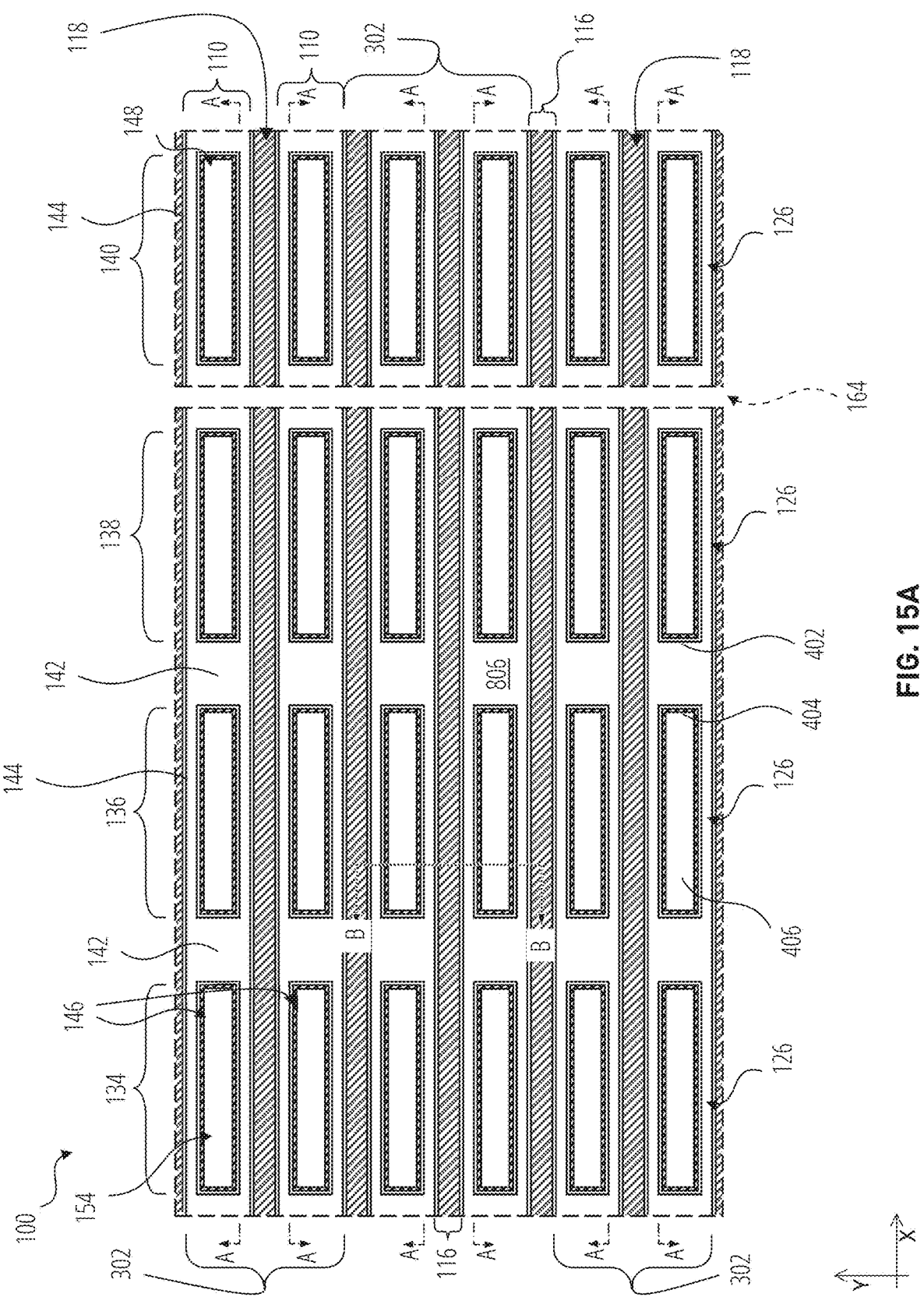
Figure 15B:
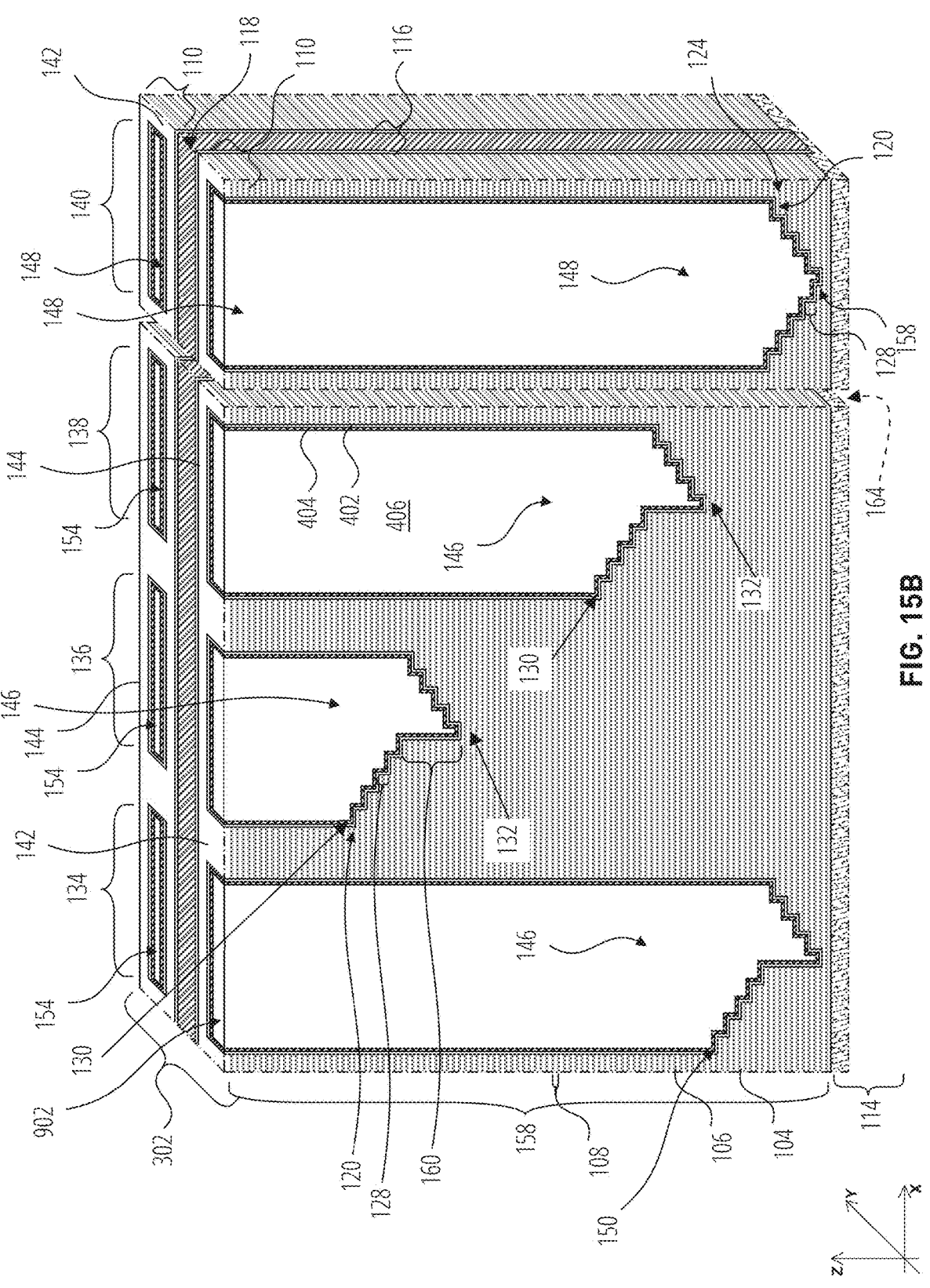
Figure 15C:
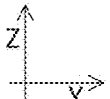

With reference to FIG. 15A, FIG. 15B, and FIG. 15C, the non-conductive material(s) of the slit structures 116 may be formed (e.g., deposited) to fill the slits 118, to form the slit structures 116.

Figure 16:
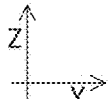

With reference to FIG. 16, initial contact openings 1602—one for each step contact 122 (FIG. 4) to be formed—may be formed (e.g., etched) through the fill materials 406 to the second stadium liner 404 above each step 120. Accordingly, the second stadium liner 404 may be formulated or otherwise configured to function as an "etch stop" material for this process, and the initial contact openings 1602 may terminate on or in the second stadium liner 404 or, in some embodiments, on, in, or below the first stadium liner 402.

Figure 17:
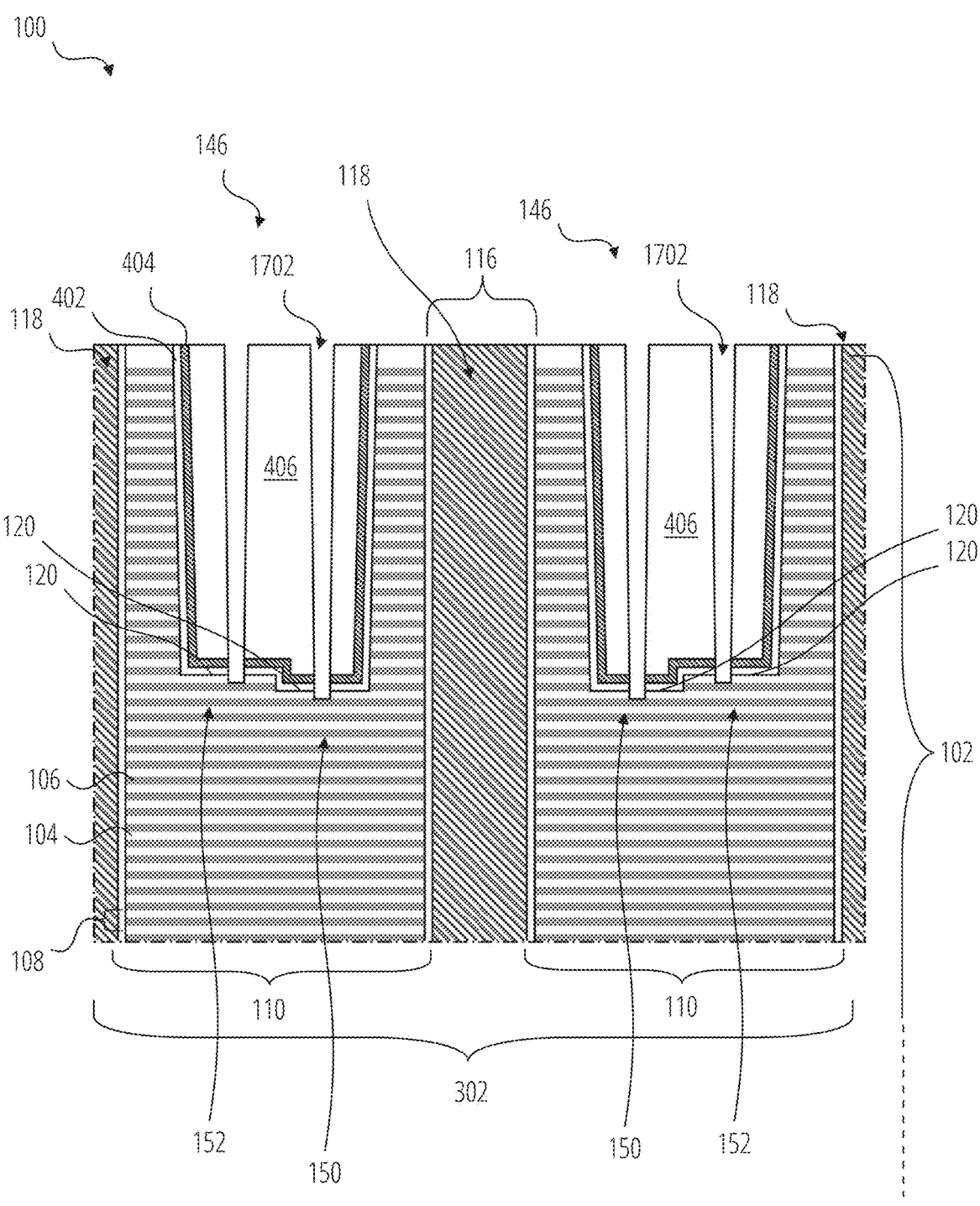

With reference to FIG. 17, in embodiments in which the initial contact openings 1602 terminate on or in the second stadium liner 404 (or the first stadium liner 402), the stadium liner(s) (e.g., the second stadium liner 404 and the first stadium liner 402) may then be etched at the base of the initial contact openings 1602 to form contact openings 1702 that extend through the fill material(s) 406, through the stadium liners (e.g., the second stadium liner 404 and the first stadium liner 402), and through the insulative structure 104 of the step 120. The contact openings 1702 may, therefore, terminate on or in the conductive structure 106 immediately below the tread of the step 120. Accordingly, the insulative structure 104 at the tread of the step 120 may provide a further insulative region and processing margin for inhibiting the contact openings 1702 from inadvertently extending to a lower conductive structure 106 than the target conductive structure 106 of the step 120.

The conductive material(s) of the step contacts 122 (FIG. 1, FIG. 4) may then be formed in the contact openings 1702, and additional conductive lines may be formed in communication with the step contacts 122 to complete the microelectronic device structure 100 of FIG. 1, FIG. 3, and FIG. 4.

Accordingly, disclosed is a method of forming a microelectronic device. The method comprises forming a tiered stack over a base structure. The tiered stack comprises a vertically alternating sequence of insulative structures and other structures arranged in tiers. Portions of the tiered stack are removed to form a first series of stadium openings and a second series of stadium openings. The stadium openings of the first series extend to various different depths in the tiered stack to define, along a base of each of the stadium openings of the first series, a single set of staircases having a staircase profile. The stadium openings of the second series extend to the various different depths in the tiered stack to define, along a base of each of the stadium openings of the second series, an additional single set of staircases having the staircase profile. The first series is longitudinally spaced from the second series by an intermediate region of the tiered stack. At least one resist material is formed in the stadium openings of the first series of stadium openings and in the stadium openings of the second series of stadium openings. A mask is formed on the at least one resist material. For each of at least some longitudinally neighboring pairs of the stadium openings of the first series and the second series, the mask is patterned to form a common mask opening, and—via the common mask opening—portions of the resist material and additional portions of the tiered stack, adjacent the intermediate region of the tiered stack, are removed. This forms, from the single set of staircases, an upper set of staircases and a lower set of staircases, and forms, from the additional single set of staircases, an additional upper set of staircases and an additional lower set of staircases.

Figure 18:
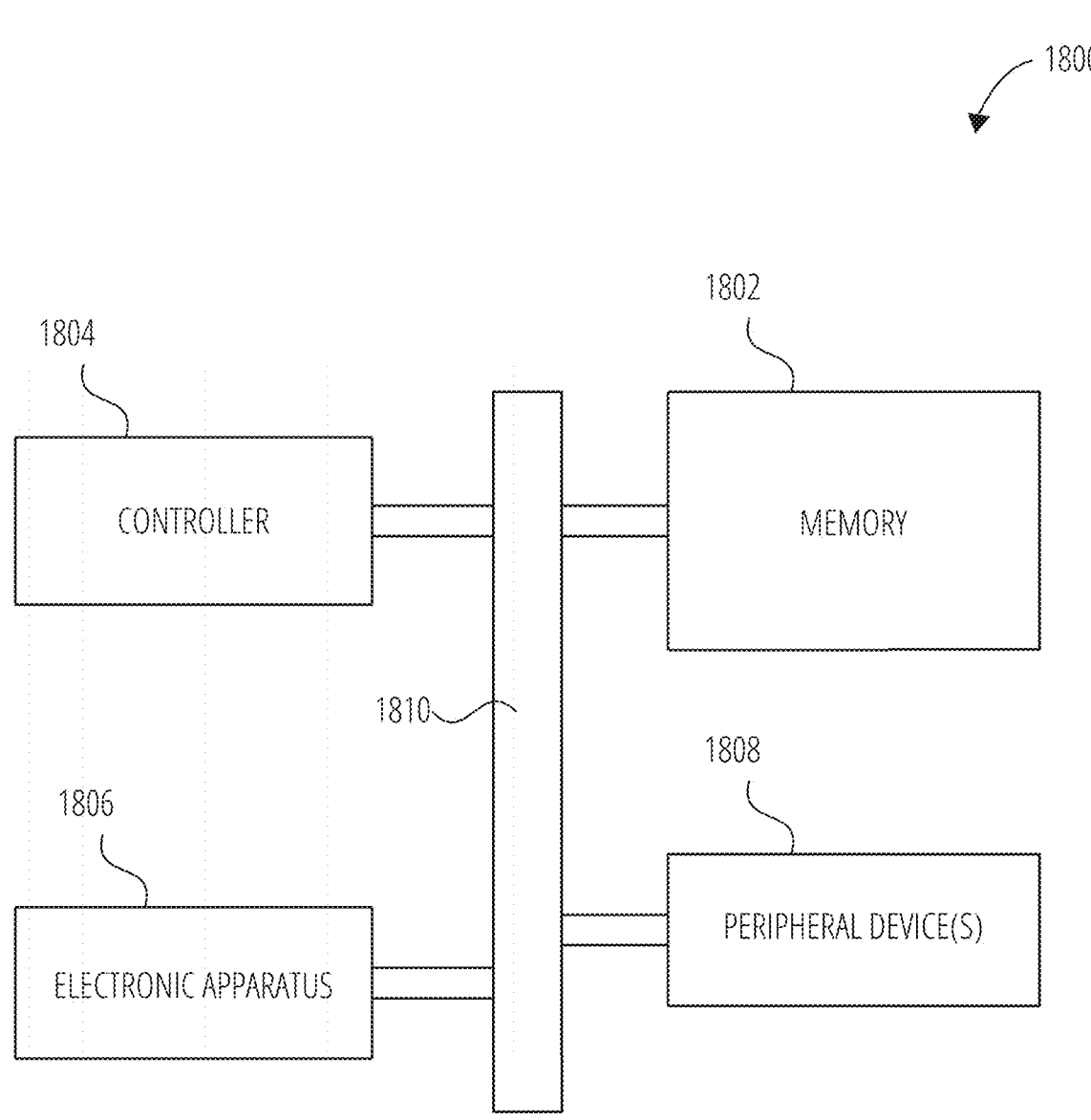
FIG. 18 is a block diagram of an electronic system including a microelectronic device that includes at least one microelectronic device structure of embodiments of the disclosure.

FIG. 18 shows a block diagram of a system 1800, according to embodiments of the disclosure, which system 1800 includes memory 1802 including arrays of vertical strings of memory cells adjacent microelectronic device structure(s) (e.g., microelectronic device structure 100 of FIG. 1, FIG. 3, and FIG. 4; and/or microelectronic device structure 700 of FIG. 7). Therefore, the architecture and structure of the memory 1802 may include one or more device structures according to embodiments of the disclosure and may be fabricated according to one or more of the methods described above (e.g., with reference to FIG. 7 through FIG. 17).

The system 1800 may include a controller 1804 operatively coupled to the memory 1802. The system 1800 may also include another electronic apparatus 1806 and one or more peripheral device(s) 1808. The other electronic apparatus 1806 may, in some embodiments, include one or more of microelectronic device structures (e.g., microelectronic device structure 100 of FIG. 1, FIG. 3, and FIG. 4; and/or microelectronic device structure 700 of FIG. 7), according to embodiments of the disclosure and fabricated according to one or more of the methods described above. One or more of the controller 1804, the memory 1802, the other electronic apparatus 1806, and the peripheral device(s) 1808 may be in the form of one or more integrated circuits (ICs).

A bus 1810 provides electrical conductivity and operable communication between and/or among various components of the system 1800. The bus 1810 may include an address bus, a data bus, and a control bus, each independently configured. Alternatively, the bus 1810 may use conductive lines for providing one or more of address, data, or control, the use of which may be regulated by the controller 1804. The controller 1804 may be in the form of one or more processors.

The other electronic apparatus 1806 may include additional memory (e.g., with one or more microelectronic device structures (e.g., microelectronic device structure 100 of FIG. 1, FIG. 3, and FIG. 4; and/or microelectronic device structure 700 of FIG. 7)), according to embodiments of the disclosure and fabricated according to one or more of the methods described above. Other memory structures of the memory 1802 and/or the other electronic apparatus 1806 may be configured in an architecture other than 3D NAND, such as dynamic random access memory (DRAM), static random access memory (SRAM), synchronous dynamic random access memory (SDRAM), synchronous graphics random access memory (SGRAM), double data rate dynamic ram (DDR), double data rate SDRAM, and/or magnetic-based memory (e.g., spin-transfer torque magnetic RAM (STT-MRAM)).

The peripheral device(s) 1808 may include displays, imaging devices, printing devices, wireless devices, additional storage memory, and/or control devices that may operate in conjunction with the controller 1804.

The system 1800 may include, for example, fiber optics systems or devices, electro-optic systems or devices, optical systems or devices, imaging systems or devices, and information handling systems or devices (e.g., wireless systems or devices, telecommunication systems or devices, and computers).

Accordingly, disclosed is an electronic system comprising a microelectronic device, at least one processor in operable communication with the microelectronic device, and at least one peripheral device in operable communication with the at least one processor. The microelectronic device comprises a stack structure comprising tiers, each of the tiers including a conductive structure and an insulative structure vertically adjacent the conductive structure. The stack structure is divided into multiple blocks by slit structures. Stadiums are within the blocks. Profiles of staircases of a series of the stadiums in one of the blocks mirrors additional profiles of additional staircases of an additional series of the stadiums in an additional one of the blocks. The additional one of the blocks is spaced from the one of the blocks by one of the slit structures. The profiles and the additional profiles mirror one another across the one of the slit structure. Conductive contact structures each extend through a different one of the insulative structures providing treads of steps of the staircases and treads of additional steps of the additional staircases.

While the disclosed structures, apparatus (e.g., devices), systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A microelectronic device, comprising:
a stack structure comprising a vertically alternating sequence of insulative structures and conductive structures arranged in tiers;
slit structures extending through the stack structure to divide the stack structure into blocks;
a first series of stadiums within the stack structure of a first block of a pair of the blocks, the first series of stadiums comprising at least one stadium comprising multiple parallel sets of staircases; and
a second series of stadiums within the stack structure of a second block of the pair of the blocks, the second series of stadiums comprising at least one additional stadium comprising additional multiple parallel sets of staircases, the additional multiple parallel sets of staircases of the second series of stadiums being mirrored across one of the slit structures to the multiple parallel sets of staircases of the first series of stadiums; and conductive contact structures extending into steps of the staircases of the multiple parallel sets of staircases and of the additional multiple parallel sets of staircases, the steps comprising treads at upper surface areas of the insulative structures of the stack structure.

2. The microelectronic device of claim 1, wherein:
the multiple parallel sets of staircases each comprise an upper set of staircases and a lower set of staircases; and
the additional multiple parallel sets of staircases each comprise an additional upper set of staircases and an additional lower set of staircases,
the upper set of staircases being elevated relative to the lower set of staircases by a height of one of the tiers, and
the additional upper set of staircases being elevated relative to the additional lower set of staircases by the height of the one of the tiers.

3. The microelectronic device of claim 1, wherein the steps of the staircases of the multiple parallel sets of staircases and of the additional multiple parallel sets of staircases each define a riser height of at least two of the tiers.

4. The microelectronic device of claim 1, wherein:
the first series of stadiums comprises at least one other stadium comprising a single set of staircases; and
the second series of stadiums comprises at least one additional other stadium comprising an additional single set of staircases.

5. The microelectronic device of claim 4, wherein:
the single set of staircases comprises a descending staircase and an ascending staircase vertically offset from the descending staircase by a height of one of the tiers; and
the additional single set of staircases comprises an additional descending staircase and an additional ascending staircase vertically offset from the additional descending staircase by the height of the one of the tiers.

6. The microelectronic device of claim 5, wherein:
the multiple parallel sets of staircases comprise an upper set of staircases and a lower set of staircases offset from the upper set of staircases by the height of the one of the tiers; and
the additional multiple parallel sets of staircases comprise an additional upper set of staircases and an additional lower set of staircases offset from the additional upper set of staircases by the height of the one of the tiers.

7. The microelectronic device of claim 1, further comprising at least one liner within the first series of stadiums and within the second series of stadiums, the at least one liner substantially conforming to a profile of the multiple parallel sets of staircases and to a profile of the additional multiple parallel sets of staircases.

8. The microelectronic device of claim 7, wherein the conductive contact structures also extend through the at least one liner.

9. The microelectronic device of claim 7, wherein the at least one liner comprises:
an oxide liner directly on the upper surface areas of the insulative structures providing the treads of the steps; and
a nitride liner directly on the oxide liner.

10. A method of forming a microelectronic device, the method comprising:
forming a tiered stack over a base structure, the tiered stack comprising a vertically alternating sequence of insulative structures and other structures arranged in tiers;

removing portions of the tiered stack to form:

a first series of stadium openings extending to various different depths in the tiered stack to define, along a base of each of the stadium openings of the first series, a single set of staircases having a staircase profile, and a second series of stadium openings extending to the various different depths in the tiered stack to define, along a base of each of the stadium openings of the second series, an additional single set of staircases having the staircase profile, the first series being longitudinally spaced from the second series by an intermediate region of the tiered stack;

forming at least one resist material in the stadium openings of the first series of stadium openings and in the stadium openings of the second series of stadium openings;

forming a mask on the at least one resist material; and for each of at least some longitudinally neighboring pairs of the stadium openings of the first series and the second series:

patterning the mask to form a common mask opening; and via the common mask opening, removing portions of the resist material and additional portions of the tiered stack adjacent the intermediate region of the tiered stack to form:

from the single set of staircases, an upper set of staircases and a lower set of staircases, and from the additional single set of staircases, an additional upper set of staircases and an additional lower set of staircases.

11. The method of claim 10, wherein removing the additional portions of the tiered stack adjacent the intermediate region of the tiered stack to form the upper set of staircases, the lower set of staircases, the additional upper set of staircases, and the additional lower set of staircases completes formation of a first series of staircased stadiums and a second series of staircased stadiums mirrored to the first series about the intermediate region.

12. The method of claim 10, wherein removing, via the common mask opening, the additional portions of the tiered stack adjacent the intermediate region of the tiered stack comprises removing the additional portions of the tiered stack a depth of about one of the tiers.

13. The method of claim 10, wherein removing, via the common mask opening, the additional portions of the tiered stack adjacent the intermediate region of the tiered stack comprises removing the additional portions of the tiered stack from only about one longitudinal half of the base of each of the stadium openings of the first series and from only about one longitudinal half of the base of each of the stadium openings of the second series.

14. The method of claim 10, further comprising, for one other of the longitudinally neighboring pairs of the stadium openings of the first series and the second series:

further patterning the mask to form a pair of additional mask openings, each above a lateral half of one of the stadium openings of the one other of the longitudinally neighboring pairs of the stadium openings; and via the pair of additional mask openings, removing additional portions of the resist material and further portions of the tiered stack in the lateral halves to form, from the single set of staircases, a descending staircase and an ascending staircase vertically offset from the descending staircase.

15. The method of claim 14, wherein removing portions of the tiered stack to form the first series of stadium openings and the second series of stadium openings comprises, for the each of the at least some longitudinally neighboring pairs of the stadium openings, forming the single set of staircases and forming the additional single set of staircases to each comprise a descending staircase vertically offset from an ascending staircase by a height of multiple of the tiers.

16. The method of claim 15, wherein removing portions of the tiered stack to form the first series of stadium openings and the second series of stadium openings further comprises, for a further one of the longitudinally neighboring pairs of the stadium openings, forming the single set of staircases and forming the additional single set of staircases to each comprise a preliminary descending staircase laterally mirrored to a preliminary ascending staircase.

17. The method of claim 10, wherein removing portions of the resist material comprises removing at least some of the resist material from above the intermediate region of the tiered stack without exposing materials of the tiered stack in the intermediate region.

18. The method of claim 10, further comprising forming a slit extending vertically through the tiered stack in the intermediate region.

19. The method of claim 18, further comprising, via the slit, substantially replacing the other structures with conductive structures.

20. An electronic system, comprising:

a microelectronic device comprising:

a stack structure comprising tiers each including a conductive structure and an insulative structure vertically adjacent the conductive structure, the stack structure being divided into multiple blocks by slit structures;

stadiums within the blocks, wherein profiles of staircases of a series of the stadiums in one of the blocks-mirrors additional profiles of additional staircases of an additional series of the stadiums in an additional one of the blocks, the additional one of the blocks being spaced from the one of the blocks by one of the slit structures, the profiles and the additional profiles mirroring one another across the one of the slit structures; and conductive contact structures each extending through a different one of the insulative structures providing treads of steps of the staircases and treads of additional steps of the additional staircases;

at least one processor in operable communication with the microelectronic device; and at least one peripheral device in operable communication with the at least one processor.

* * * * *